US006707601B2

(12) United States Patent
Suenaga et al.

(10) Patent No.: US 6,707,601 B2
(45) Date of Patent: Mar. 16, 2004

(54) EXPOSURE APPARATUS AND METHOD

(75) Inventors: Yutaka Suenaga, Yokohama (JP);
Yasuhiro Omura, Chuo-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/419,006

(22) Filed: Apr. 21, 2003

(65) Prior Publication Data

US 2003/0210459 A1 Nov. 13, 2003

Related U.S. Application Data

(62) Division of application No. 10/208,748, filed on Aug. 1, 2002, now Pat. No. 6,646,797, which is a division of application No. 09/721,957, filed on Nov. 27, 2000, now Pat. No. 6,452,723, which is a division of application No. 09/377,010, filed on Aug. 18, 1999, now Pat. No. 6,451,507.

(30) Foreign Application Priority Data

Aug. 18, 1998 (JP) .............................. 10-231531

(51) Int. Cl.$^7$ ............................... G02B 13/14
(52) U.S. Cl. ..................... 359/356; 359/350; 359/357; 359/361
(58) Field of Search ................. 359/356, 357, 359/350, 361, 355, 368, 326, 365, 366; 355/52, 53, 67, 77

(56) References Cited

U.S. PATENT DOCUMENTS

| 4,740,067 | A | 4/1988 | Ueda |
| 5,251,070 | A | 10/1993 | Hashimoto et al. |
| 5,402,267 | A | 3/1995 | Furter et al. |
| 5,477,304 | A | 12/1995 | Nishi |
| 5,493,446 | A | 2/1996 | Nakajima |
| 5,650,877 | A | 7/1997 | Phillips, Jr. et al. |
| 5,668,672 | A | 9/1997 | Oomura |
| 5,742,436 | A | 4/1998 | Furter |
| 5,753,926 | A | 5/1998 | Sato |
| 5,835,284 | A | 11/1998 | Takahashi et al. |
| 5,880,891 | A | 3/1999 | Furter |
| 5,978,070 | A | 11/1999 | Sakuma et al. |
| 6,115,194 | A | 9/2000 | Yoneyama |
| 6,198,576 | B1 | 3/2001 | Matsuyama |
| 6,373,869 | B1 | 4/2002 | Jacob |
| 6,377,338 | B1 | 4/2002 | Suenaga |
| 6,451,507 | B1 | 9/2002 | Suenaga et al. |
| 6,452,723 | B1 | 9/2002 | Suenaga et al. |
| 6,473,242 | B2 | 10/2002 | Schauss |
| 6,496,306 | B1 | 12/2002 | Shafer et al. |

FOREIGN PATENT DOCUMENTS

| EP | A2-0 816 892 | 1/1998 |
| JP | A-1-198759 | 8/1989 |
| JP | A-5-173065 | 7/1993 |
| JP | A-8-64505 | 3/1996 |
| JP | A-8-330220 | 12/1996 |
| JP | A-9-246139 | 9/1997 |
| JP | A-9-246140 | 9/1997 |
| JP | A-10-104513 | 4/1998 |
| JP | A-10-284408 | 10/1998 |
| WO | WO99/25008 | 5/1999 |

OTHER PUBLICATIONS

US 6,538,822, 3/2003, Schuster (withdrawn)

Primary Examiner—Mohammad Sikder
(74) Attorney, Agent, or Firm—Oliff & Berridge PLC

(57) ABSTRACT

An exposure apparatus (PE1) and exposure method for use in photolithographically manufacturing devices such as semiconductor devices, image pickup devices, liquid crystal display devices and thin film magnetic heads. The apparatus is capable of transferring onto a substrate (W) the image of a pattern on a reticle (R) and includes a light source (2) capable of supplying an exposure energy beam (IL) with a wavelength under 200 nm, and an illumination optical system arranged to receive the exposure energy beam from said light source. The illumination optical system is designed to guide the exposure energy beam to the reticle. The apparatus also includes a projection optical system (PL) arranged between the reticle and the substrate. The projection optical system is capable of forming an image of the reticle pattern onto the substrate based on the exposure energy beam passing through the reticle. The projection optical system has a plurality of refractive optical members, wherein at least two such refractive optical members are arranged along an optical path of said exposure energy beam, and wherein each refractive optical member is made of at least two types of fluoride crystalline materials.

10 Claims, 15 Drawing Sheets

EXPOSURE APPARATUS AND METHOD

This is a Division of application Ser. No. 10/208,748 filed Aug. 1, 2002 now U.S. Pat. No. 6,646,797, which in turn is a Divisional of application Ser. No. 09/721,957 filed Nov. 27, 2000 (now U.S. Pat. No. 6,452,723), which is a Divisional of application Ser. No. 09/377,010 filed Aug. 18, 1999 (now U.S. Pat. No. 6,451,507). The entire disclosure of the prior application(s) is hereby incorporated by reference herein in its entirety.

FIELD OF THE INVENTION

The present invention relates to an exposure apparatus and exposure method, and in particular those used in photolithography for manufacturing devices such as semiconductor devices, image pickup devices, liquid crystal display devices and thin film magnetic heads.

BACKGROUND OF THE RELATED ART

When manufacturing semiconductor devices and the like, either a static exposure-type (e.g., stepper) or a scanning exposure-type (e.g., step-and-scan system) projection exposure apparatus is used to transfer the image of the pattern of a reticle as a mask onto a wafer (or glass plate and the like) coated with resist, via a projection optical system. With the advance of finer patterns in semiconductor integrated circuits and the like, it is desirable to improve the resolving power of the projection optical system provided in such exposure apparatus. This can be accomplished by shortening the exposure wavelength or increasing the numerical aperture (N.A.)

The g-line (436 nm wavelength) to the i-line (365 nm wavelength) of a mercury lamp have principally been used in recent years for the exposure light (exposure energy beam). Recently, however, exposure light of shorter wavelength, e.g., KrF excimer laser light (248 nm wavelength), as well as light in the deep ultraviolet region and the vacuum ultraviolet region of an ArF excimer laser (193 nm wavelength) or $F_2$ laser (157 nm wavelength) are being employed.

Projection optical systems using an exposure energy beam in the ultraviolet region below 200 nm are proposed in, for example, Japanese Patent Application Kokai No. Hei 5-173065, and U.S. Pat. Nos. 5,402,267 and 5,668,672.

The optical systems proposed in the above references include refractive optical elements made of synthetic silica ($SiO_2$). If an exposure energy beam in the ultraviolet region under 200 nm is used as the exposure light, there is a risk the synthetic silica, which includes oxygen ($O_2$), will absorb the exposure energy beam in this wavelength region. This is because this wavelength region is near the absorption band of oxygen. In addition, there is also a risk that contamination in the manufacturing process of the synthetic silica by impurities will reduce the transmittance (i.e., increase the absorptance) in this wavelength region.

Absorption of the exposure energy beam in this wavelength region by a synthetic silica optical members will produce heat. This, in turn, can lead to a change in the shape of the surface of the optical members due to thermal expansion, or a change in the refractive index of the silica itself. If this type of fluctuation is produced by the exposure energy beam, the performance of the projection optical system will deteriorate, making it difficult to transfer a fine pattern.

On the other hand, advances have been made in narrowing the spectral bandwidth of the light source that supplies the exposure energy beam in the wavelength region under 200 nm. However, in actuality, the exposure energy beam has a finite bandwidth. Accordingly, the correction of chromatic aberration in a projection optical system is still essential for transferring the pattern on a mask onto a substrate while maintaining adequate contrast.

The optical members in the projection optical systems of the abovementioned Japanese Patent Application Kokai No. Hei 5-173065 and U.S. Pat. No. 5,402,267 are made of only one type of silica. Thus, there is a risk of deterioration in imaging performance due to fluctuations in irradiation if used in combination with a light source that supplies an exposure energy beam with a wavelength under 200 nm. In addition, chromatic aberration in U.S. Pat. No. 5,668,672 is corrected by combining silica and fluorite lenses. However, since silica exists in the projection optical system, there is a risk that imaging performance will deteriorate due to fluctuations in irradiation if used in combination with a light source that supplies an exposure energy beam with a wavelength under 200 nm. Thus, the transfer of fine patterns is problematic in the systems disclosed in the above references.

SUMMARY OF THE INVENTION

The present invention relates to an exposure apparatus and exposure method, and in particular those used in photolithography for manufacturing devices such as semiconductor devices, image pickup devices, liquid crystal display devices and thin film magnetic heads.

Accordingly, a first goal of the present invention is to reduce the absorption of the exposure energy beam by the optical members in the projection optical system to a level at which there is substantially no effect, and to transfer extremely fine patterns without producing fluctuations in irradiation due to changes in the optical properties of the optical members induced by the exposure energy beam.

A second goal of the present invention is a method of manufacturing the exposure apparatus according to the present invention in a manner that provides an exposure apparatus that can transfer extremely fine patterns, resulting in devices having high-density patterns.

A first aspect of the invention is an exposure apparatus capable of transferring onto a wafer the image of a pattern on a reticle. The apparatus comprises a light source capable of supplying an exposure energy beam with a wavelength under 200 nm and an illumination optical system arranged to receive the exposure energy beam from the light source. The illumination optical system is designed to guide the exposure energy beam to the reticle. The apparatus also includes a projection optical system arranged between the reticle and the substrate, capable of forming an image of the reticle pattern onto the substrate based on the exposure energy beam passing through the reticle. The projection optical system has a plurality of refractive optical members, wherein at least two dioptric optical members of the plurality of refractive optical members are arranged along an optical path of the exposure energy beam, and wherein each refractive optical member in the plurality of dioptric optical members is made of at least two types of fluoride crystalline materials.

A second aspect of the invention is a method of exposing onto a substrate the image of a pattern provided on a reticle. The method comprises the steps of first, supplying an exposure energy beam with a wavelength under 200 nm, then guiding the exposure energy beam to the reticle and through at least two refractive optical members, then forming the image of the reticle pattern onto the substrate, wherein all refractive optical members positioned between the reticle and the substrate are made of at least two types of fluoride crystalline materials.

A third aspect of the invention is a method of manufacturing an exposure apparatus, including the steps of providing a light source capable of supplying an exposure energy beam having an optical path and a wavelength under 200 nm, then forming a first refractive optical element from a first fluoride crystal, then forming a second dioptric optical element from a second fluoride crystal different from the first fluoride crystal, and then arranging the first and second dioptric optical elements along the optical path of the exposure energy beam.

DETAILED DESCRIPTION OF PREFERRED EMBODIMENTS

The present invention relates to an exposure apparatus and exposure method, and in particular those used in photolithography for manufacturing devices such as semiconductor devices, image pickup devices, liquid crystal display devices and thin film magnetic heads.

Figure 1:
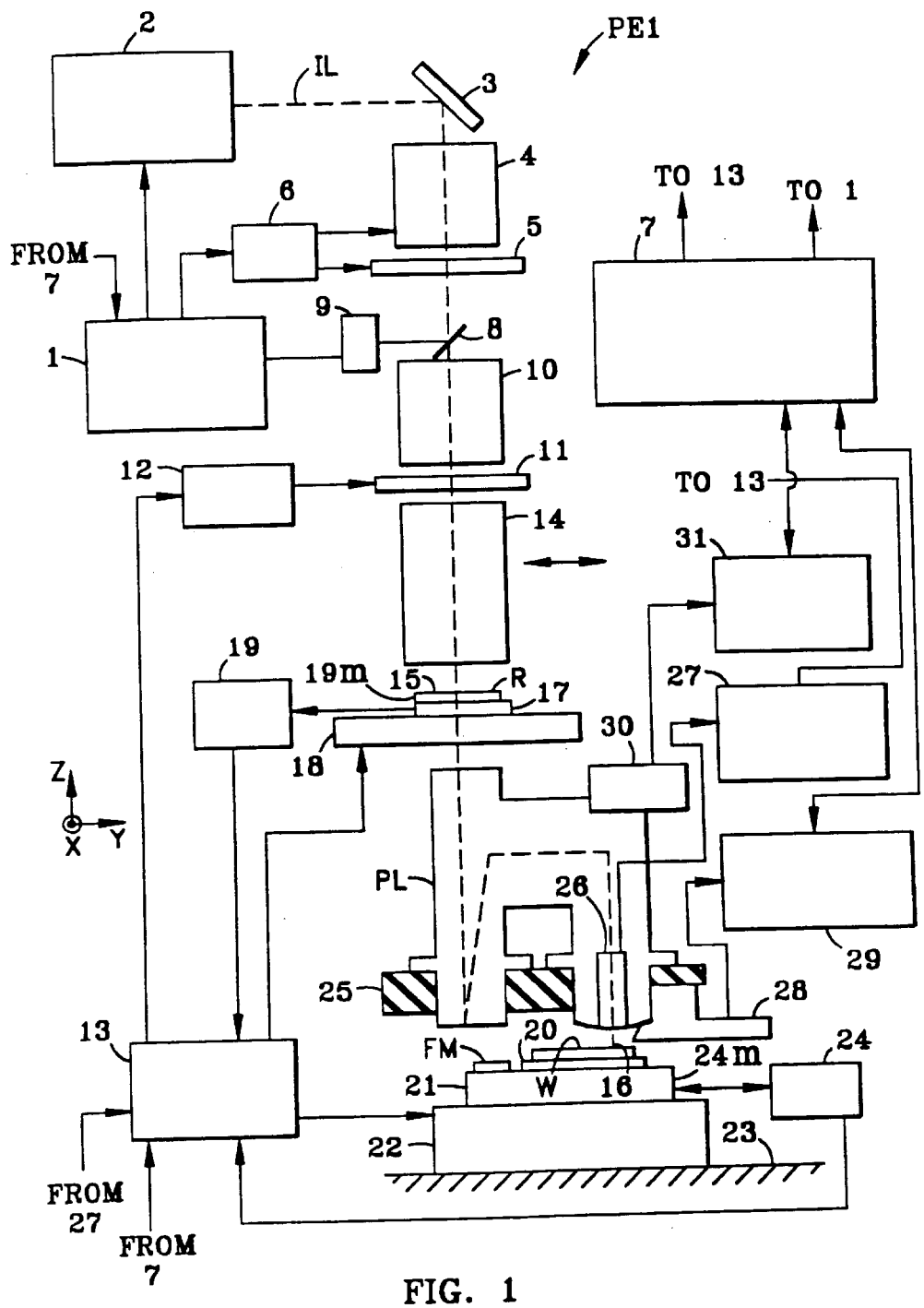
FIG. 1 is a schematic diagram of the first embodiment of the exposure apparatus according to the present invention.
Figure 2:
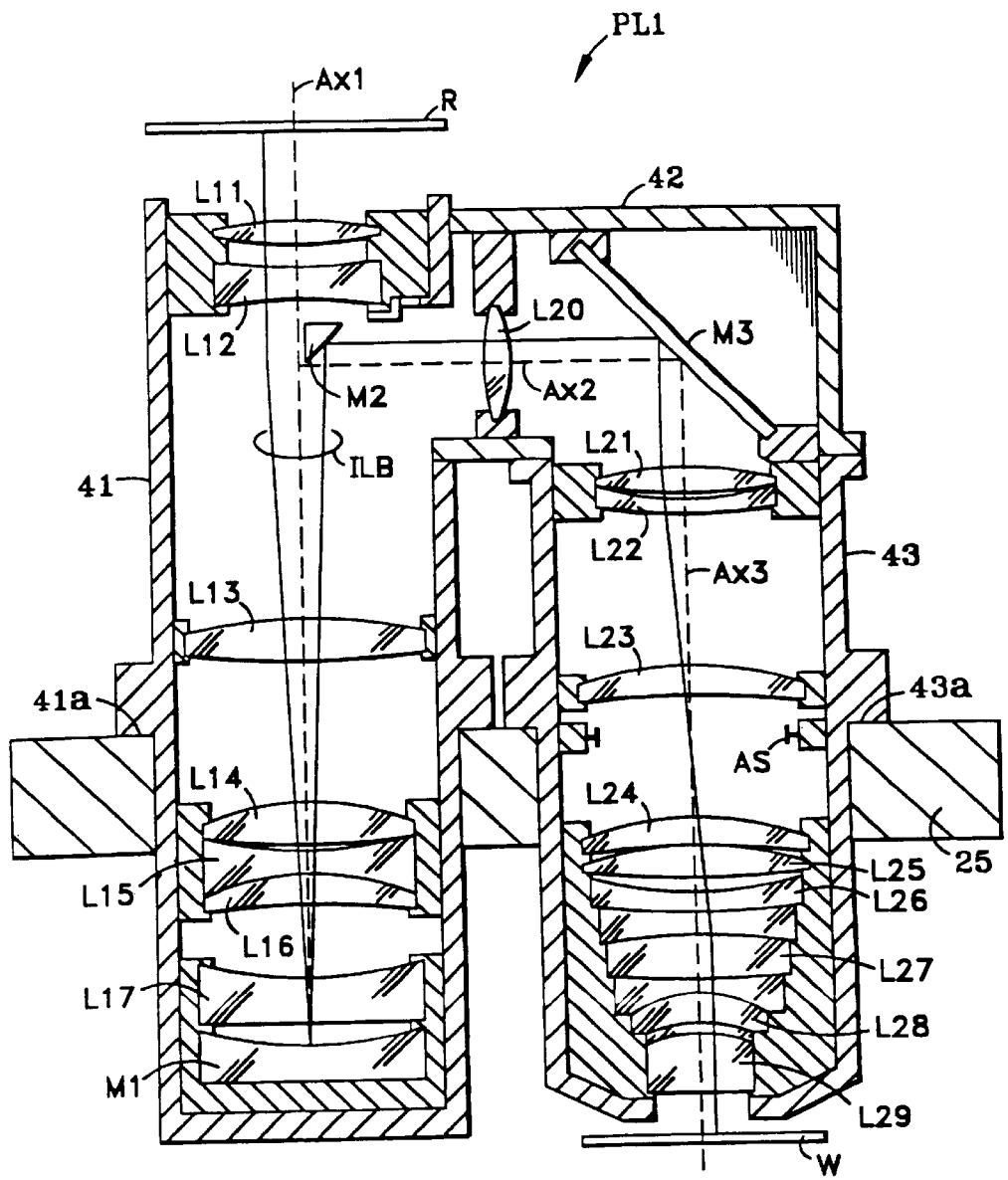
FIG. 2 is a cross-sectional view of the projection optical system in FIG. 1.
Figure 3:
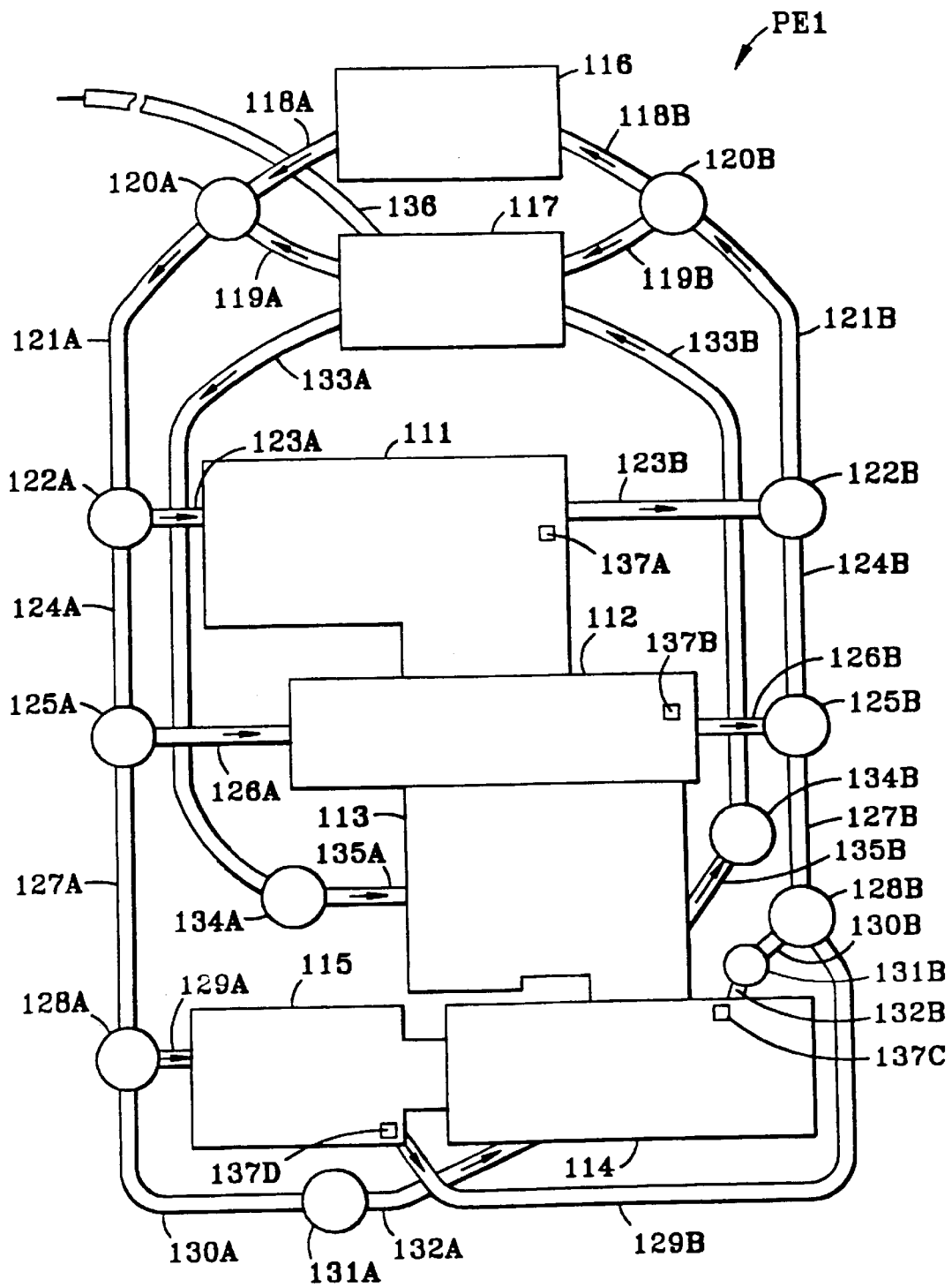
FIG. 3 is a schematic diagram of the air conditioning system by unit according to the first embodiment for carrying out the present invention.

A first preferred embodiment of the present invention is now explained, referencing FIG. 1 to FIG. 3. The exposure apparatus of the first embodiment uses an excimer laser light source as the exposure light source (radiation source), and applies the present invention to a step-and-scan type projection exposure apparatus wherein a catadioptric system is used as the projection optical system.

With reference to FIG. 1, projection exposure apparatus PE1 includes an illumination light beam IL (the exposure energy beam) comprising pulsed laser light emitted from an excimer laser light source 2, wherein the light-emitting state is controlled by an exposure control apparatus 1. In the present example, an ArF excimer laser (193 nm wavelength), wherein the full width at half maximum (FWHM) of the oscillation spectrum is on the order of 10 pm, is used as excimer laser light source 2. However, a narrowband laser light source of an ArF excimer laser, wherein the full width at half maximum of the oscillation spectrum is narrowbanded to, for example, under 1 pm, or an $F_2$ laser light source (157 nm wavelength) may also be used as light source 2. Generally, any type of light source may be used as long as it supplies an exposure energy beam (exposure light) having a wavelength under 200 nm. Beam IL is deflected by folding a mirror 3 and then reaches a first illumination optical system 4.

First illumination optical system 4 preferably includes a beam splitter (not shown), a light quantity varying mechanism (not shown), an illumination switching mechanism (not shown) for switching the quantity of light of the illumination light if the coherence factor (so-called σ value) of the illumination optical system changes, and an optical integrator (not shown). Furthermore, secondary light sources (not shown), which are distributed in the surface shape of illumination light beam IL, are formed in the exit surface of first illumination optical system 4. A switching revolver 5 for the illumination optical system aperture stop is arranged in the plane wherein the secondary light sources are formed, to variously switch the illumination conditions. Switching revolver 5 includes a regular circular aperture stop (not shown), an aperture stop for so-called modified illumination comprising a plurality of apertures eccentric from the optical axis (not shown), an annular aperture stop (not shown), and an aperture stop for a small σ value comprising a small circular aperture (not shown). By rotating switching revolver 5 via switching apparatus 6, the desired illumination optical system aperture stop (σ stop) can be arranged at the exit surface of first illumination optical system 4. In addition, if the illumination optical system aperture stop is switched in this manner, illumination switching apparatus in first illumination optical system 4 switches, synchronized by switching apparatus 6, so that the quantity of light is maximized.

The operation of switching apparatus 6 is controlled by exposure control apparatus 1 electrically connected thereto, and the operation of exposure control apparatus 1 is controlled by a main control apparatus 7 electrically connected thereto, which provides general control of the operation of the entire apparatus.

A fly's eye lens may be used as the optical integrator. Also, a rod-type optical integrator (e.g. glass rod, kaleidoscope rod, light pipe, light tunnel, etc.) may also be used. In this case, the secondary light sources in the vicinity of the incident surface of the rod-type integrator are formed as virtual images. Thus, a mechanism for switching the shape of the light source images at the pupil of the projection optical system can be provided in a plane conjugate to the secondary light sources in the optical system (corresponding to a third illumination optical system in the present example) that forms an image of the exit surface of the rod-type integrator onto a reticle R. In addition, the shape of the light source images can be changed even if a mechanism is provided that changes the convergent state of the light beam impinging on the incident surface of the rod-type integrator.

Illumination light beam IL transmitted through the illumination optical system aperture stop set by switching revolver 5 impinges on a beam splitter 8 having high transmittance and low reflectance. Illumination light beam IL reflected by beam splitter 8 is received by an integrator sensor 9 comprising a photoelectric detector, such as a photodiode. The illumination light is photoelectrically converted by integrator sensor 9, and the detection signal obtained is supplied to exposure control apparatus 1 electrically connected thereto. The relationship between this detection signal and the quantity of exposure light on a wafer W is measured in advance and stored, and exposure control apparatus 1 monitors the cumulative quantity of exposure light on wafer W by this detection signal. In addition, this detection signal is also used to normalize the output signal of the various sensor systems that use illumination light beam IL for exposure light.

Illumination light beam IL transmitted through beam splitter 8 illuminates an illumination field stop system (reticle blind system) 11 via a second illumination optical system 10. The plane wherein illumination field stop system 11 is arranged is conjugate to the incident surface of the optical integrator in first illumination optical system 4. Illumination field stop system 11 is illuminated at an illumination region substantially similar to the cross-sectional shape of each lens element of the optical integrator. Illumination field stop system 11 is divided into a moveable blind (not shown) and a fixed blind (not shown). The fixed blind is a field stop having a fixed rectangular aperture, and the moveable blind is a pair of moveable blades that can freely open and close and that move independently in the scanning direction and non-scanning direction of the reticle. The shape of the illumination region on the reticle is determined by the fixed blind. The moveable blind performs the operation of gradually opening and closing the covering of the aperture of the fixed blind when starting and stopping the scanning exposure, respectively. Illumination by the illumination light beam IL of the region outside of the proper exposure region on the wafer is thus prevented.

The operation of the moveable blind in illumination field stop system 11 is controlled by a drive apparatus 12. When reticle R and wafer W are synchronously scanned by a stage control apparatus 13, as described later, the stage control apparatus synchronously drives the moveable blind via drive apparatus 12. Illumination light beam IL passing through illumination field stop system 11 illuminates a rectangular illumination region 15, with a uniform illumination intensity distribution, en the pattern surface (lower surface) of reticle R via third illumination optical system 14. The plane wherein the fixed blind of illumination field stop system 11 is arranged is conjugate to the pattern surface of reticle R. The shape of illumination region 15 is specified by the aperture of the fixed blind.

In the explanation below, the X axis is perpendicular to the paper surface of FIG. 1 in a plane parallel to the pattern surface of reticle R. The Y axis is parallel to the paper surface of FIG. 1. The Z axis is perpendicular to the pattern surface of reticle R. Illumination region 15 on reticle R is a rectangular region long in the X direction. When performing scanning and exposure, reticle R is scanned in the +Y direction or −Y direction with respect to illumination region 15. Namely, the scanning direction is set to the Y direction.

The pattern in illumination region 15 on reticle R is reduced by projection magnification β (|β| is, for example, ¼, ⅕, ⅙ and the like) via a projection optical system PL, which is telecentric on both sides (or on one side, i.e., the wafer side), and is imaged and projected onto an exposure region 16 on wafer W coated with photoresist.

Reticle R is held on a reticle stage 17, which is mounted via an air (gas) bearing onto a guide extending in the Y direction on a reticle support stage 18. Reticle stage 17 can scan, at a constant speed, reticle support stage 18 in the Y direction using a linear motor (not shown), and is provided with an adjustment mechanism that can adjust the position of reticle R in the X direction, Y direction and rotational direction (θ direction). The position in the X direction and Y direction of reticle stage 17 (reticle R) is continuously measured, with a resolution on the order of 0.001 μm (1 nm) for example, by a movable mirror 19m fixed to the end face of reticle stage 17, and by a laser interferometer 19 fixed to a column (not shown), the rotational angle of reticle stage 17 is also measured. The measured values are supplied to stage control apparatus 13, which controls the operation of the linear motor and the like on reticle support stage 18 in accordance with the supplied measured values.

Wafer W is held on a specimen stage 21 via a wafer holder 20. Specimen stage 21 is mounted on a wafer stage 22, which is mounted via an air bearing on a guide on table 23. Furthermore, wafer stage 22 is constructed so that it can scan at a constant speed or step in the Y direction by a linear motor (not shown) on a table 23, and can step also in the X direction. In addition, a Z stage mechanism that moves specimen stage 21 over a predetermined range in the Z direction, and a tilt mechanism (leveling mechanism) that adjusts the inclination angle of specimen stage 21 are incorporated in wafer stage 22.

The position of specimen stage 21 (wafer W) in the X direction and Y direction is continuously monitored, at a resolution on the order of 0.001 μm for example, by a movable mirror 24m fixed to the side part of specimen stage 21, and by a laser interferometer 24 fixed to a column (not shown). The rotational angle and tilt angle of specimen stage 21 are also measured, and the measured values supplied to stage control apparatus 13 electrically connected thereto. Stage control apparatus 13 controls the operation of a linear motor and the like for driving wafer stage 22 in accordance with the supplied measured values.

When scanning and exposing, an exposure start command is sent from main control apparatus 7 to stage control apparatus 13. In response, stage control apparatus 13 scans, at speed VW, wafer W in the Y direction via wafer stage 22 synchronized to the scanning, at speed VR, of reticle R in the Y direction via reticle stage 17. The scanning speed VW of wafer W is set to β·VR using the projection magnification β from reticle R to wafer W. In addition, projection optical system PL is held on the center plate of column 25 (see FIG. 2), which is planted on an external base member. Furthermore, at the side part in the X direction of projection optical system PL, an oblique incidence-type multipoint autofocus sensor 26 (hereinafter called an AF sensor) is arranged that obliquely projects a slit image and the like to a plurality of measurement points on the surface of wafer W, and then outputs a plurality of focus signals corresponding to the position in the Z direction of that plurality of measurement points (focus positions). The plurality of focus signals from multipoint AF sensor 26 is supplied to focus and tilt control apparatus 27 electrically connected thereto, which calculates the focus position and inclination angle of the surface of wafer W from the plurality of focus signals, and supplies the calculated results to stage control apparatus 13.

Stage control apparatus 13 servo drives a Z stage mechanism and tilt mechanism inside wafer stage 22 so that the supplied focus position and inclination angle respectively coincide with the pre-calculated focus position and inclination angle of the imaging plane of projection optical system PL. The surface in exposure region 16 on wafer W is thus controlled by the autofocus system and autoleveling system, even during scanning exposure, so that it coincides with the imaging plane of projection optical system PL.

With continuing reference to FIG. 1, apparatus PE1 further includes an off-axis system alignment sensor 28 fixed to the side in the +Y direction of projection optical system PL.

When performing alignment, the position of the wafer mark for alignment supplementally provided in each exposure region on wafer W is detected by alignment sensor 28. The detection signals are then supplied to an alignment signal processing apparatus 29. The measured values of laser interferometer 24 are also supplied to alignment signal processing apparatus 29, which calculates, based on the detection signals and the measured values of laser interferometer 24, the coordinates of the stage coordinate system (XY) of the wafer mark to be detected, and supplies them to main control apparatus 7 electrically connected thereto. The stage coordinate system (XY) refers to the coordinate system prescribed by the X coordinate and Y coordinate of specimen stage 21 measured by laser interferometer 24. Main control apparatus 7 calculates, based on the supplied wafer mark coordinates, the coordinates where the stage coordinate system (XY) of each exposure region on wafer W is arrayed, and supplies them to stage control apparatus 13. Stage control apparatus 13 controls the position of wafer stage 22 when scanning and exposing each exposure region based on the supplied array coordinates.

In addition, a reference mark member FM is fixed to specimen stage 21. Various reference marks constituting the positional reference of the alignment center and a reference reflection surface that constitutes the reflectance reference of wafer W are formed on the surface of reference mark member FM. Furthermore, a reflected light detection system 30 that detects the light beam reflected from the wafer W side via projection optical system PL is attached to the upper end part of projection optical system PL. The detection signal of reflected light detection system 30 is supplied to a self-measurement apparatus 31 electrically connected thereto. Based on the control of main control apparatus 7, as discussed later, self-measurement apparatus 31 monitors the amount of reflection (reflectance) of wafer W, measures the unevenness of the illumination intensity, and measures the spatial image.

The following provides a detailed explanation of the construction of a projection optical system PL1 of the first embodiment of projection optical system PL of the present invention. With reference to FIG. 2, projection optical system PL1 mechanically comprises a first lens barrel unit 41, a folding unit 42 and the partial lens barrel of a second lens barrel unit 43. Furthermore, a concave mirror M1 is arranged inside first lens barrel unit 41.

First lens barrel unit 41 holds, via a lens frame, each optical element of the first imaging system that includes a plurality of refractive optical members (lens elements) L11 to L17 and concave mirror M1. In addition, folding unit 42 holds folding mirror M2 arranged between the first imaging system and the second imaging system, and holds folding mirror M3 in the second imaging system. Folding unit 42 also holds, via a lens frame, refractive optical member L20 (lens element) arranged between folding mirrors M2, M3.

Furthermore, second lens barrel unit 43 holds, via a lens frame, an aperture stop AS and a plurality of refractive optical members L21 to L29 in the second imaging system. Accordingly, the first imaging system forms, in the vicinity of folding mirror M2, an intermediate image of illumination region 15 on reticle R with a slight reduction magnification. The second imaging system reimages that intermediate image on exposure region 16 on wafer W with a predetermined reduction magnification.

In projection optical system PL1, dioptric optical members L11 to L17 and concave mirror M1 inside first lens barrel unit 41 are arrayed along an optical axis Ax1, refractive optical member L20 inside folding unit 42 is arrayed along an optical axis Ax2 substantially orthogonal to optical axis Ax1, and refractive optical members L21 to L29 inside second lens barrel unit 43 are arrayed along an optical axis Ax3 substantially parallel to optical axis Ax1.

Folding mirror M2 is inclined at substantially 45° in the +Y direction with respect to optical axis Ax1 at a position off-centered in the +Y direction from optical axis Ax1 inside folding unit 42. In addition, folding mirror M3 is inclined at substantially 45° with respect to optical axis Ax2 at the position wherein optical axis Ax2 and optical axis Ax3 intersect inside folding unit 42.

In the first embodiment of the present invention, each refractive optical member L11 to L29 and the concave mirror are arranged on mutually orthogonal optical axes Ax1 to Ax3.

In this case, rectangular illumination region 15 on reticle R produced by illumination light beam IL is set at a position off-centered from optical axis Ax1 in the −Y direction, the illumination light (hereinafter called imaging light beam ILB) that passes through illumination region 15 impinges on concave mirror M1 via lenses L11, L12, . . . , L17 inside first illumination optical system 41. Imaging light beam ILB is reflected and converged by concave mirror M1, once again passes through lenses L17, L15, . . . , L13, and is then deflected in the +Y-direction by folding mirror M2 inside folding unit 42.

In folding unit 42, imaging light beam ILB reflected by folding mirror M2 impinges on folding mirror M3 via lens L20. Imaging light beam ILB deflected in the −Z direction by folding mirror M3 proceeds toward second lens barrel unit 43, where the imaging light beam forms a reduced image of the pattern in illumination region 15 on reticle R onto exposure region 16 on wafer W via lenses L21, L22, . . . , L28, L29.

In projection optical system PL1, first lens barrel unit 41 and second lens barrel unit 43 are supported by flanges 41a, 43a on the upper plate of column 25 of exposure apparatus PE1. Folding unit 42 is provided so that the first and second lens barrel units 41, 43 are connected.

A fluoride crystal having sufficient transmittance with respect to an exposure energy beam with a wavelength under 200 nm is used for each of the optical members in the projection optical system according to the present invention. Thus, the absorption of the exposure energy beam by the refractive optical members in the projection optical system of the present invention is reduced to an order wherein there is substantially no effect, and the generation of fluctuations in irradiation due to the absorption of the exposure energy beam can be substantially ignored.

In addition, since at least two types of fluoride crystals are used for each of the refractive optical members, it is possible to correct chromatic aberration by using materials having different dispersions.

In addition, if one type among the at least two types of fluorides used in the refractive optical members is fluorite, manufacturing and processing of the refractive optical members is relatively easy. This is because manufacturing method and fabrication method are relatively well established for fluorite.

In a preferable embodiment of the exposure apparatus according to the present invention, the following condition is satisfied:

$$0.60 < \Sigma Dc/\Sigma D < 0.98 \quad (1)$$

wherein $\Sigma D$ is the sum of the axial thicknesses of all the optical members through which the exposure energy beam passes in the projection optical system, and $\Sigma Dc$ is the sum of the axial thicknesses of the refractive optical members made of fluorite.

Condition (1) stipulates the proportion of fluorite (calcium fluoride) in the refractive optical members made of fluorides in the projection optical system. If $\Sigma Dc/\Sigma D$ falls below the lower limit in condition (1), manufacturing and fabrication of the refractive optical members becomes difficult, since the proportion of other fluorides that are difficult to manufacture and fabricate compared with fluorite increases. In addition, if $\Sigma Dc/\Sigma D$ exceeds the upper limit in condition (1), it is difficult to correct chromatic aberration of the projection optical system.

Furthermore, in a preferred embodiment for carrying out the present invention, the projection optical system includes at least two positive lenses made of fluorite. Among the fluorides, fluorite is a material with a comparatively large Abbe number (small dispersion). Chromatic aberration (principally axial chromatic aberration) produced by the refractive optical members can be corrected by the combined usage of fluorite in the positive lenses and a fluoride having an Abbe number smaller than fluorite in the negative lens. Since two or more positive lenses are preferably used, a large imagewise numerical aperture can be achieved. This allows a fine pattern to be transferred onto a substrate with good contrast.

In addition, in a preferred embodiment of the present invention, one type among the at least two types of fluorides that constitute the refractive optical members in the projection optical system is barium fluoride. Barium fluoride has a comparatively small Abbe number among fluorides, and chromatic aberration can be corrected by combining it with other fluorides having large Abbe numbers.

At this point, it is preferable to include in the projection optical system a negative lens made of at least one barium fluoride crystalline material. Since barium fluoride has a comparatively small Abbe number, as discussed above, chromatic aberration produce by the refractive optical members (principally axial chromatic aberration) can be satisfactorily corrected by combining a negative lens made of barium fluoride with, for example, a positive lens made of fluorite having a large Abbe number.

Furthermore, in a preferred embodiment of the exposure apparatus according to the present invention, part of the optical path from the light source to the substrate forms a sealed space sealed from the outside atmosphere. This sealed space is filled with a gas (e.g., an inert gas like nitrogen) wherein the oxygen concentration is reduced. Since the light source in the present invention supplies light having a wavelength close to the absorption band of oxygen, the energy loss can be reduced if the oxygen concentration of the gas in the optical path of the exposure energy beam is reduced.

There are many fluoride crystals that are somewhat water soluble. Thus, it is preferable to arrange refractive optical members made of a fluoride crystal in a sealed space sealed from the outside air, and to fill that sealed space with gas having an extremely low moisture content. This is effective particularly for dioptric optical members made of lithium fluoride. Satisfactory stability over time is thus obtained for the optical performance of the projection optical system.

In addition, in a preferred embodiment of the exposure apparatus according to the present invention, the illumination optical system that guides the exposure energy beam from the light source onto the reticle comprises at least one of a concave mirror and a refractive optical member made of a fluoride crystalline material. This allows the absorption of the exposure energy beam to be reduced even in the illumination optical system.

In the exposure apparatus according to a preferred embodiment of the present invention, the at least two types of fluoride crystalline materials that constitute the refractive optical members in the projection optical system include a first fluoride crystalline material having a first dispersion of $dn1/d\lambda$, and a second fluoride crystalline material having a second dispersion of $dn2/d\lambda$, and the following condition is satisfied:

$$0.1 \times 10^6 [pm^{-1}] < |(dn1/d\lambda) - (dn2/d\lambda)| \quad (2)$$

Condition (2) stipulates the condition to satisfactorily correct chromatic aberration in the projection optical system. If $|(dn1/d\lambda) - (dn2/d\lambda)|$ in condition (2) deviates from the specified range, chromatic aberration is inadequately corrected.

In a preferred embodiment of the exposure apparatus according to the present invention, the at least two types of fluoride crystalline materials are at least two types of materials selected from among the group comprising calcium fluoride ($CaF_2$), barium fluoride ($BaF_2$), lithium fluoride (LiF), magnesium fluoride ($MgF_2$), lithium calcium aluminum fluoride ($LiCaAlF_6$), and lithium strontium aluminum fluoride ($LiSrAlF_6$).

Among fluorides, the abovementioned fluoride crystals are easiest to fabricate and manufacture optical elements so that the manufacture of a projection optical system as well as the manufacture of an exposure apparatus are simplified by selecting materials from this group.

The projection optical system discussed above preferably includes at least one concave mirror arranged in the optical path of the exposure energy beam. The projection optical system has an overall positive power (positive refractive power), its Petzval sum is positive and the image plane tends to curve toward the negative. Even though it has positive power, the concave mirror has a negative Petzval sum, and does not produce chromatic aberration. Consequently, it can correct the Petzval sum while providing the positive power of the projection optical system. Thus, the burden of correcting the Petzval sum in the refractive optical members is reduced, allowing the refractive optical members to correct chromatic aberration instead of aberrations generally. The concave mirror itself does not produce chromatic aberration, so that the chromatic aberration produced by the refractive optical members themselves (principally axial chromatic aberration) are preferably corrected by two or more types of fluorides.

The projection optical system according to one preferred embodiment having the above-described configuration (i.e., a configuration wherein the projection optical system includes at least one concave mirror arranged in the optical path of the exposure energy beam) includes a first imaging system having a concave mirror and a positive lens group comprising a plurality of refractive optical members, a folding mirror arranged between the first imaging system and the image plane, and a second imaging system that includes a plurality of refractive optical members arranged between the folding mirror and the image plane. The exposure energy beam from the object sequentially passes through the positive lens group, the concave mirror, the folding mirror and the second imaging system, and then reaches the image plane. Accordingly, it is preferable that the first imaging system form an intermediate image at a position that does not include the optical axis in a plane orthogonal to the optical axis of the projection optical system. It is also preferable that the second imaging system reimage in the image plane the intermediate image with a reduction magnification.

In the above configuration, the second imaging system comprising refractive optical members is arranged on the reduction side through which a light beam of a comparatively large numerical aperture passes. Thus, it is possible, even though it has a high numerical aperture, to avoid physical interference of the optical members (i.e., the refractive optical members, the concave mirror and the like) that constitute the projection optical system.

Accordingly, it is preferable in the projection optical system according to one of the above preferred embodiments that a plurality of refractive optical members in at least the first imaging system be made of two or more fluoride crystals. Here, it is preferable to use a material having a small dispersion $dn/d\lambda$ as the positive lens, and to use a material having a large dispersion $dn/d\lambda$ as the negative lens. This construction enables the correction of axial chromatic aberration produced by the refractive optical members themselves.

A concave mirror is preferably arranged at an appropriate position in the projection optical system according to one of the above preferred embodiments. Thus, the amount of chromatic difference of magnification (lateral chromatic aberration) produced is comparatively small. Nevertheless, to further correct lateral chromatic aberration, it is preferable to construct the plurality of refractive optical members that constitute the second imaging system with at least two types of fluoride crystals. Here, it is preferable to use a material having a large dispersion $dn/d\lambda$ as the positive lens, and to use a material having a small dispersion $dn/d\lambda$ as the negative lens.

The projection optical system according to another preferred embodiment in the above configuration (i.e., a configuration wherein the projection optical system includes at least one concave mirror arranged in the optical path of the exposure energy beam) is provided with a first lens group comprising a plurality of refractive optical members, a beam splitter, a concave mirror, and a second lens group comprising a plurality of optical members and having a positive refractive power. In this configuration, the exposure energy beam from the object sequentially passes through the first lens group, the beam splitter, the concave mirror, the beam splitter and the second lens group, and then reaches the image plane.

Accordingly, in the projection optical system according to another preferred embodiment, the plurality of refractive optical members that constitute at least the second lens group are preferably be made of two or more fluoride crystals. At this point, it is preferable that the second lens group have a positive lens made of a material having a small dispersion $dn/d\lambda$, and a negative lens made of a material having a large dispersion $dn/d\lambda$. This allows the axial chromatic aberration produced by the refractive optical members to be satisfactorily corrected.

In the projection optical system according to another preferred embodiment, it is preferable that the plurality of refractive optical members that constitute the first lens group be made of two or more types of fluoride crystals. Here, it is preferable that the first lens group have a positive lens made of a material having a large dispersion $dn/d\lambda$, and a negative lens made of a material having a small dispersion $dn/d\lambda$. This allows the lateral chromatic aberration produced by the refractive optical members to be satisfactorily corrected.

In the projection optical system according to a preferred embodiment at least one of the refractive surfaces of the refractive optical members or the reflective surface of the concave mirror is an aspherical surface. This allows aberrations to be satisfactorily corrected even if the overall size of the projection optical system is reduced.

In another preferred embodiment of the exposure apparatus according to the present invention, only optically transmissive members are arranged in the optical path of the exposure energy beam of the projection optical system. Furthermore, an optically transmissive member refers to a refractive optical member like a lens or optically transmissive plane parallel plate, a transmissive-type diffractive optical element provided on an optically transmissive substrate, and the like.

In addition, in a preferred embodiment the exposure apparatus according to the present invention, the projection optical system has an optical axis extending in a single straight line. By constructing the projection optical system in this manner, the optical members constituting the projection optical system can be held by a straight (non-folded) lens barrel. This allows for ease of manufacture and adjustment of the projection optical system to be made easier, which in turn leads to higher accuracy.

Furthermore, the exposure apparatus according to the present invention preferably includes a process that prepares a light source that provides an exposure energy beam with a wavelength under 200 nm, a process that forms a first dioptric optical element from a first fluoride crystal, a process that forms a second dioptric optical element from a second fluoride crystal different from the first fluoride crystal, and a process that arranges the first and second dioptric optical elements along the optical path of the exposure energy beam from the light source. These processes are set up by electrically, mechanically or optically linking them so that the aforementioned functions are achieved.

In another embodiment of the exposure apparatus according to the present invention, the exposure apparatus comprises a radiation source 2 capable of supplying an exposure energy beam with a wavelength below 200 nm, an illumination optical system arranged to receive the exposure energy beam, capable of directing the exposure energy beam toward mask (reticle) R, and a projection optical system PL arranged between mask R and wafer W, capable of forming the image of the pattern based on the exposure energy beam from the mask. Projection optical system PL includes at least two refractive optical members arranged along an optical path of the exposure energy beam, wherein all optically transmissive materials positioned in said optical path of the exposure energy beam are made at least two types of materials other than silica.

In another embodiment of the exposure apparatus according to the present invention, the exposure apparatus comprises a radiation source 2 capable of supplying an exposure energy beam with a wavelength below 200 nm, an illumination optical system arranged to receive the exposure energy beam, capable of directing the exposure energy beam toward a mask (reticle) R, and a projection optical system PL arranged between the mask and wafer W capable of forming the image of the pattern based on the exposure energy beam from the mask. The projection optical system includes a concave mirror L21, a beam splitter BS made of a fluoride crystalline material, a first lens group G1 arranged between the beam splitter and mask R, and a second lens group G3 arranged between the beam splitter and the wafer. The exposure energy beam from the mask sequentially passes through first lens group G1, the beam splitter, is reflected by the concave mirror, passes back through the beam splitter and second lens group G3, and onto wafer W.

In another embodiment of the exposure apparatus according to the present invention, the exposure apparatus comprises a radiation source 2 capable of supplying an exposure energy beam with a wavelength below 200 nm, an illumination optical system, arranged to receive the exposure energy beam, capable of directing the exposure energy beam toward mask (reticle) R, and a projection optical system PL, arranged between the mask and wafer W, capable of forming the image of the pattern based on the exposure energy beam from the mask. The illumination optical system has a plurality of refractive optical members in an optical path of said exposure energy beam. All of the refractive optical members in the optical path of the exposure energy beam are made of a fluoride crystalline material.

The following explains the air conditioning system of projection exposure apparatus PE1 of the first embodiment for carrying out the present invention. The projection exposure apparatus according to the present example is installed as a whole inside a chamber. The projection exposure apparatus is divided into a plurality of units, each unit being independently air conditioned. This type of air conditioning system will hereinafter be called a "by-unit air conditioning system."

FIG. 3 shows the by-unit air conditioning system of projection exposure apparatus PE1 according to the first embodiment of the present invention. With reference to FIG. 3, projection exposure apparatus PE1 (see FIG. 1) is broadly divided into an illumination optical system unit 111, a reticle stage system unit 112, a projection optical system unit 113, a wafer stage system unit 114 and a wafer transport system unit 115. Specifically, illumination optical system unit 111 houses, inside a box-shaped casing, the illumination optical system comprising excimer laser light source 2, folding mirror 3, first illumination optical system 4, switching revolver 5, beam splitter 8, integrator sensor 9, second illumination optical system 10, illumination field stop system 11 and third illumination optical system 14, as shown in FIG. I. In addition, reticle stage system unit 112 houses, inside a box-shaped casing, reticle support stage 18, reticle stage 17 (including movable mirror 19m), reticle R, the optical path between reticle R and third illumination optical system 14, and the optical path between reticle R and projection optical system PL, as shown in FIG. 1.

Although projection optical system unit 113 is projection optical system PL itself in FIG. 1, the lens barrel of projection optical system PL is regarded as the casing. The latter is constructed so that the flow of gas between the lens groups inside the casing can be controlled. Furthermore, wafer stage system unit 114 houses, inside the box-shaped casing installed on table 23 of FIG. 1, wafer stage 22, specimen stage 21 (including movable mirror 24m and reference mark member FM), wafer holder 20, wafer W, and the spacing between projection optical system PL and wafer W. Also, wafer transport system unit 115 houses, inside a box-shaped casing, the wafer transport system (not shown in FIG. 1). In the present example, a predetermined gas can be independently supplied to and exhausted from illumination optical system unit 111, reticle stage system unit 112, projection optical system unit 113, wafer stage system unit 114 and wafer transport system unit 115.

The air conditioning apparatus of the present invention is provided with a first air conditioning apparatus 116 having a built-in dust removal filter and ozone removal filter (not shown), and a second air conditioning apparatus 117 that circulates nitrogen ($N_2$) gas supplied by a nitrogen gas cylinder (not shown). Furthermore, first air conditioning apparatus 116 removes dust and the like, via the dust removal filter, from the air taken in from outside the chamber and from the air that returns via a pipe 118B, adjusts the temperature and flow rate of the air from which ozone has been removed by the ozone removal filter, and supplies that air after adjustment to an air switcher 120A via pipe 118A. On the other hand, second air conditioning apparatus 117 adjusts the temperature and flow rate of the high-purity portion of the nitrogen gas that returns via pipes 119B, 133B, circulates it via pipes 119A, 133A, and discharges the high-purity portion via a pipe 136 into the atmosphere outside the clean room in which the chamber is installed. Furthermore, second air conditioning apparatus 117 supplements the deficiency in nitrogen gas by the nitrogen gas cylinder. In other words, it purges the deficiency.

Next, a gas switcher 120A supplies to an air conditioning air volume controller 122A via a pipe 121A one of two types of supplied gases (air after ozone removal, or nitrogen gas). Air conditioning air volume controller 122A supplies gas into illumination optical system unit 111 via a pipe 123A, and also supplies gas to an air conditioning air volume controller 125A via a pipe 124A. Air conditioning air volume controllers 122A, 125A (and likewise for others) have a jet function that adjusts the temperature and flow rate (air volume) of each of the supplied gases. Furthermore, air conditioning air volume controller 125A supplies gas into reticle stage system unit 112 and to an air conditioning air volume controller 128A via pipes 126A, 127A, respectively. Furthermore, air conditioning air volume controller 128A supplies gas into wafer transport system unit 115 via a pipe 129A, and also supplies gas into wafer stage system unit 114 via a pipe 130A, an air conditioning air volume controller 131A and a pipe 132A.

In addition, the gas that circulates inside wafer transport system unit 115 is exhausted to an air conditioning air volume controller 128B via a pipe 129B. The gas that circulates inside wafer stage system unit 114 is exhausted to air conditioning air volume controller 128B via a pipe 132B, air conditioning air volume controller 131B and pipe 130B. The gas that exhausts from air conditioning air volume controller 128B and the gas that circulates inside reticle stage system unit 112 are exhausted to air conditioning air volume controller 125B via pipes 127B, 126B, respectively. Likewise, the construction is such that the gas exhausted from air conditioning air volume controller 125B and the gas that circulates inside illumination optical system unit 111 are exhausted to air conditioning air volume controller 122B via pipes 124B, 123B, respectively. The gas that exhausts from air conditioning air volume controller 122B is supplied to gas switcher 120B via pipe 121B. The gas supplied by gas switcher 120B, if air, returns to first air conditioning apparatus 116 via pipe 118B. If nitrogen gas, it returns to second air conditioning apparatus 117 via pipe 119B. Accordingly, illumination optical system unit 111, reticle stage system unit 112, wafer stage system unit 114 and wafer transport system unit 115 can jointly and selectively supply either nitrogen gas or air from which ozone has been removed.

Second air conditioning apparatus 117 is constructed so that temperature- and flow rate-controlled nitrogen gas is supplied to projection optical system unit 113 via a pipe 133A, air conditioning air volume controller a 134A and a pipe 135A. The nitrogen gas that circulates inside projection optical system unit 113 returns to second air conditioning apparatus 117 via a pipe 135B, an air conditioning air volume controller 134B and a pipe 133B. Accordingly, unlike other units, projection optical system unit 113 is constructed so that only nitrogen gas is continuously supplied. This is because projection optical system PL does not require maintenance. In other words, projection optical system unit 113 is constructed so that it maintains strong airtightness with respect to the outside, and so that nitrogen gas is continuously supplied.

Temperature and purity sensors (not shown) that measure the temperature purity, respectively, of the nitrogen gas are each installed in air conditioning air volume controllers 134A, 134B. When the measured purity falls below a predetermined permissible value, the nitrogen gas of low purity in second air conditioning apparatus 117 is exhausted to the outside via pipe 136. The deficiency is supplemented by the nitrogen gas cylinder.

In projection exposure apparatus PE1 of the present invention, excimer laser light source 2, such as an ArF excimer laser or $F_2$ laser, is used as the exposure light source. With respect to, for example, ArF excimer laser light, absorptance among the regular components of air is highest for ozone ($O_3$), followed by the high absorptance when oxygen ($O_2$) changes to ozone, and the absorptance of nitrogen gas, the latter of which is on an order that can be, for practical purposes, ignored. Consequently, if gas is flowed in the optical path of illumination light beam IL for exposure, wafer W can be most efficiently exposed (with a high transmittance) by flowing nitrogen gas.

Accordingly, with reference to FIG. 3, in the normal exposure sequence, gas switcher 120A supplies nitrogen gas from second air conditioning apparatus 117 to pipe 121A. Illumination optical system unit 111, reticle stage system unit 112, wafer stage system unit 114 and wafer transport system unit 115 are jointly supplied with nitrogen gas, and transferring and exposing reticle R onto wafer W are performed with high illumination efficiency.

If exposure is performed during maintenance or for test purposes, nitrogen gas cannot be supplied from the viewpoint of safety, since there is a possibility that the casing of a unit other than projection optical system unit 113 may be opened by an operator. Consequently, during maintenance and the like, gas switcher 120A supplies air, after ozone has been removed, from first air conditioning apparatus 116 to pipe 121A. Thereby, illumination optical system unit 111, reticle stage system unit 112, wafer stage system unit 114 and wafer transport system unit 115 are jointly supplied with that air, and the operator can perform the work safely. Moreover, the gas supplied to units other than projection optical system unit 113 is air after ozone has been removed. Thus, the reduction in illumination efficiency is slight, since the absorptance with respect to illumination light beam IL for exposure is low.

In addition, concentration sensors 137A to 137D for nitrogen gas are respectively arranged in the vicinity of exhaust outlets inside illumination optical system unit 111, reticle stage system unit 112, wafer stage system unit 114 and wafer transport system unit 115. The detection results of concentration sensors 137A to 137D are supplied to main control apparatus 7 (see FIG. 1). When, during maintenance and the like, switching the gas supplied to these units to air after ozone has been removed, main control apparatus 7 does not display that it is OK to start maintenance work and locks the cover of the chamber in a closed state until the nitrogen concentration detected by concentration sensors 137A to 137D reaches the concentration level of regular air. The work may then be performed safely.

A timer (not shown) is also preferably connected to main control apparatus 7. When main control apparatus 7 switches the gas supplied to these units during maintenance and the like to air after ozone has been removed, an "OK to start maintenance work" message may be displayed after a predetermined time interval has elapsed.

Since absorptance depends on the type of gas present along the optical path of the illumination light for exposure, main control apparatus 7 is constituted so that the illumination intensity on the surface of wafer W with respect to each gas is stored as a parameter which is converted when switching the type of gas.

Although gas is supplied in parallel, for example, to illumination optical system unit 111, reticle stage system unit 112, wafer stage system unit 114 and wafer transport system unit 115, all or part of these units may be connected in series by piping, and the selected gas may be supplied to the connected units in series. The arrangement of piping is thereby simplified.

Air after ozone has been removed is obtained only by passing the intake air (outside air) through an ozone removal filter. However, nitrogen gas requires the replacement of a nitrogen gas cylinder when used continuously, and also requires partial replacement with air during exposure and during maintenance. Accordingly, if the exposure required by the photoresist coated on the wafer is large (i.e., the sensitivity is low), nitrogen gas must be flowed, in order to increase throughput, to the range of illumination optical system unit 111 to wafer transport system unit 115, which lowers the absorptance of the illumination light. However, if the exposure required by the photoresist is small (i.e., the sensitivity is high), there is almost no impact on throughput even if the quantity of light is reduced by absorption, and air after ozone has been removed may therefore be flowed thereto. Thus, overall throughput and operating costs can be optimized by selecting the proper gas to be used based on the sensitivity condition.

If the amount of exposure required by the photoresist is small, as in the latter case, air itself (from the atmosphere) taken in externally may be used in place of air after ozone has been removed. Furthermore, other gases (for example, inactive gases like helium, and the like) having a low absorptance with respect to ArF excimer laser light or $F_2$ laser light may be used in place of nitrogen gas.

The following explains the second preferred embodiment of the exposure apparatus according to the present invention.

Figure 4:
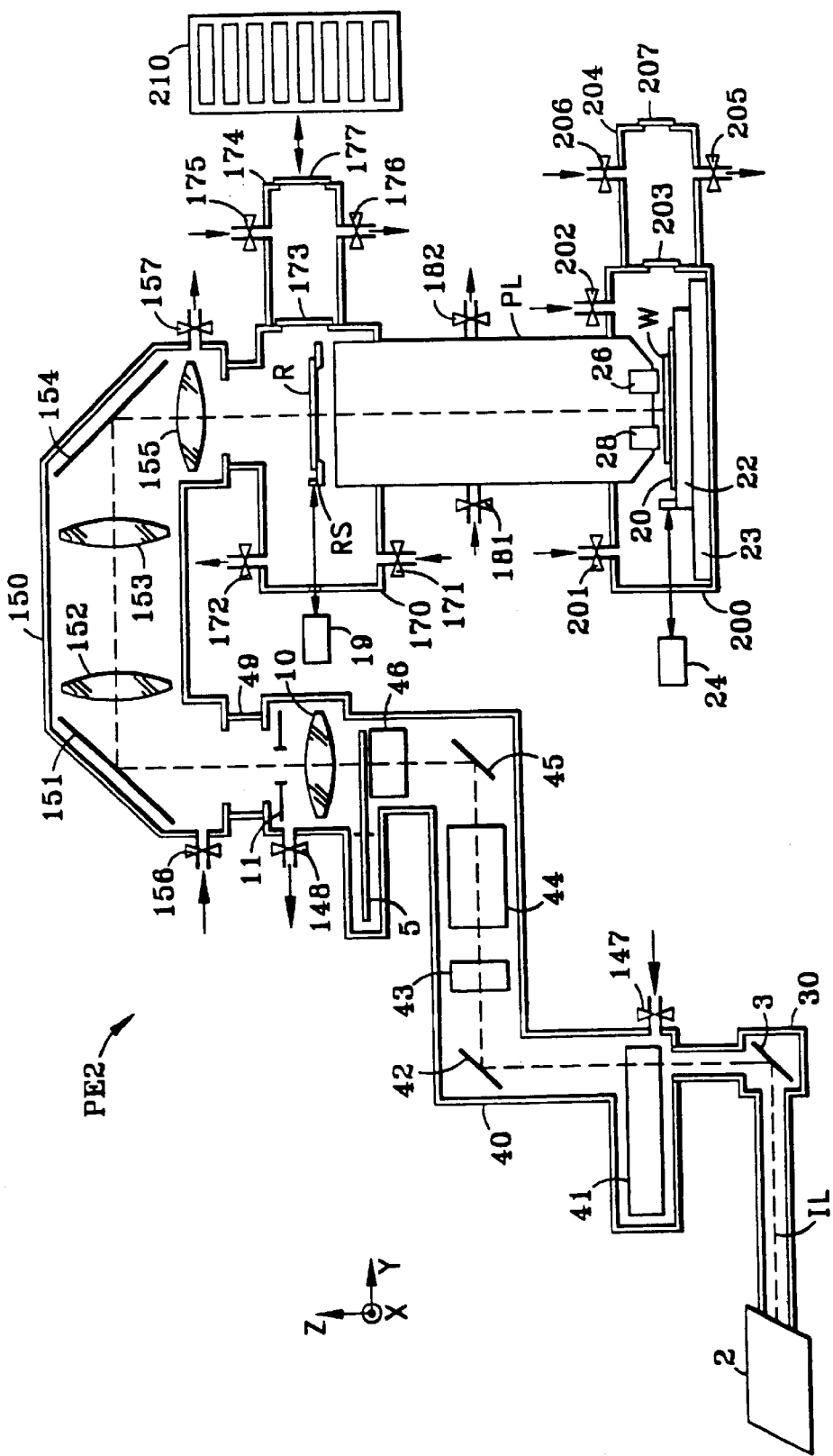
FIG. 4 is a schematic diagram of the second embodiment of the exposure apparatus according to the present invention.

With reference to FIG. 4, an XYZ coordinate system is employed, the same as in FIG. 1. Furthermore, any member having the same function as that in the first embodiment of the present invention, as described above, is assigned the same symbol.

Projection exposure apparatus PE2 of the second embodiment of the present invention preferably uses an $F_2$ laser light source as exposure light source 2, and applies the present invention to a projection exposure apparatus that uses a dioptric optical system as projection optical system PL. Projection exposure apparatus PE2 of the second embodiment of the present invention exposes the region of the first column on wafer W by synchronously scanning reticle R and wafer W in a predetermined first direction relative to the illumination region of a predetermined shape on the reticle. Subsequently, reticle R is replaced, or the reticle is moved by a predetermined amount along a second direction orthogonal to the first direction of the above illumination region, and wafer W is horizontally shifted in a direction conjugate to the second direction of the illumination region. Furthermore, the region of the second column on wafer W is exposed by once again synchronously scanning reticle R and wafer W in the first direction relative to the illumination region of a predetermined shape on the reticle. Thus, projection exposure apparatus PE2 is a stitching and slit scan-type exposure apparatus that can expose a reticle pattern onto an exposure region on wafer W that is larger than the exposure field of projection optical system PE2. Such a stitching and slit scan-type exposure apparatus is disclosed in U.S. Pat. No. 5,477,304, Japanese Patent Application Kokai No. Hei 8-330220, Japanese Patent Application Kokai No. Hei 10-284408 and U.S. patent application Ser. No. 654,747, filed on 5/29/96. This U.S. patent and U.S. patent application are incorporated herein by reference in their entirety.

In FIG. 4, laser light source 2 preferably comprises a fluorine dimer laser ($F_2$ laser) having an oscillation wavelength of, for example, 157 nm. This $F_2$ laser has a sufficiently narrow full width at half maximum on the order of 1.5 pm at the natural frequency. Furthermore, by selecting a single spectrum from the spectral distribution at the natural frequency, a spectrum having a full width at half maximum on the order of 1 pm can be obtained. Laser light source 2 may also be a light source that emits light in the vacuum ultraviolet region having a wavelength of approximately 120 to approximately 180 nm. Examples include a krypton dimer laser ($Kr_2$ laser) having an oscillation wavelength of 146 nm, an argon dimer laser ($Ar_2$ laser) having an oscillation wavelength of 126 nm.

The pulsed laser light (illumination light) from laser light source 2 is deflected to a folding mirror 3, proceeds to an optical path delaying optical system 41, and is temporally divided into a plurality of light beams each given an optical path length differential greater than the temporal interference distance (coherence length) of the illumination light from laser light source 2. Such an optical path delaying optical system is disclosed in, for example, Japanese Patent Application Kokai No. Hei 1-198759. In addition, the optical system disclosed in U.S. patent application Ser. No. 09/300,660, filed on Apr. 27, 1999, can be used as the optical path delaying optical system. U.S. patent application Ser. No. 09/300,660 is incorporated herein by reference in its entirety.

Illumination light beam IL emitted from optical path delaying optical system 41 is deflected by folding mirror 42 and then reaches a second fly's eye lens 46 via a first fly's eye lens 43, zoom lens 44 and vibrating mirror 45, in that order. Switching revolver 5 for the illumination optical system aperture stop, for setting the desired size and shape of the effective light source, is arranged on the exit side of second flyeye lens 46. In the present example, the size of the light beam from zoom lens 44 to second flyeye lens 46 is made variable to reduce the quantity of light lost at the illumination optical system aperture stop.

Illumination light beam IL emitted from the illumination optical system aperture stop (set by switching revolver 5) illuminates illumination field stop 11 (reticle blind) via condenser lens group 10. The light from illumination field stop 11 is guided onto reticle R via the illumination field stop imaging optical system (reticle blind imaging system) comprising folding mirrors 151, 154 and lens groups 152, 153, 155. An illumination region that is an image of the opening of illumination field stop 11 is formed on reticle R. The light from the illumination region on reticle R is guided onto wafer W via projection optical system PL constructed with materials comprising a plurality of types of fluoride crystals as discussed above. A reduced image of the pattern in the illumination region of reticle R is formed on wafer W.

If light having a wavelength in the vacuum ultraviolet region is made the exposure light, gases having strong absorption characteristics with respect to the light of the wavelength band in question (hereinafter properly called "absorbent gases"), such as oxygen, water vapor and hydrocarbons, must be eliminated from that optical path.

Accordingly, in projection exposure apparatus PE2, the illumination optical path (i.e., the optical path from laser light source 2 to reticle R) and the projection optical path (i.e., the optical path from reticle R to wafer W) must be cut off from the external atmosphere. These optical paths must be filled with gases like nitrogen, helium, argon, neon and krypton, which are specific gases having little absorption with respect to light in the vacuum ultraviolet region, or gas mixtures thereof (hereinafter properly called "low absorbent gases" or "specific gases").

Specifically, the optical path from laser light source 2 to optical path delaying optical system 41 is cut off from the external atmosphere by a casing 30. The optical path from optical path delaying optical system 41 to illumination field stop 11 is cut off from the external atmosphere by a casing 40. The illumination field stop imaging optical system is cut off from the external atmosphere by a casing 150. These optical paths are filled with a specific gas. In addition, the lens barrel of projection optical system PL itself constitutes a casing, and the optical path inside thereof is filled with a specific gas.

A casing 170 cuts off from the external atmosphere the space between casing 150, which houses the illumination field stop imaging optical system, and projection optical system PL, and houses a reticle stage RS, which holds reticle R therein. Casing 170 is provided with door 173 for inward and outward transport of reticle R. A gas replacement chamber 174 is provided outside of door 173 to prevent contamination of the atmosphere inside casing 170 during inward and outward transport of reticle R. Gas replacement chamber 174 is also provided with a door 177. The transfer of reticles between gas replacement chamber 174 and a reticle stocker 210, which stores multiple types of reticles R, is accomplished via door 177.

A casing 200 cuts off from the external atmosphere the space between projection optical system PL and wafer W, and houses wafer stage 22 that holds wafer W, oblique incidence-type autofocus sensor 26 for detecting the Z-direction position (focus position) and inclination angle of the surface of wafer W as the substrate, off-axis alignment sensor 28, and table 23 whereon wafer stage 22 is mounted. Casing 200 is provided with a door 203 for inward and outward transport of wafer W, and a gas replacement chamber 204 is provided outside of door 203 to prevent contamination of the atmosphere inside casing 200. Gas replacement chamber 204 is provided with a door 207, and transport of wafer W into and outside of the apparatus is accomplished via door 207.

Casings 40, 150, 170, 200 are provided with intake valves 147, 156, 171, 201, respectively. Intake valves 147, 156, 171, 201 are connected to intake conduits connected to a gas supply apparatus (not shown). In addition, casings 40, 150, 170, 200 are respectively provided with exhaust valves 148, 157, 172, 202. These exhaust valves 148, 157, 172, 202 are each connected to the above gas supply apparatus via exhaust conduits (not shown). Furthermore, the specific gas from the gas supply apparatus is adjusted by a temperature adjustment apparatus (not shown) to a predetermined target temperature.

Likewise, gas replacement chambers 174, 204 are also provided with intake valves 175, 205 and exhaust valves 176, 206, and intake valves 175, 205. Exhaust valves 176, 206 are respectively connected via intake conduits and exhaust conduits to the abovementioned gas supply apparatus. Furthermore, projection optical system PL is provided with intake valve 181 and exhaust valve 182. Intake valve 181 and exhaust valve 182 are connected to the abovementioned gas supply apparatus via an intake conduit (not shown) and an exhaust conduit (not shown), respectively.

Filters like HEPA filters or ULPA filters for removing dust (particles) and chemical filters for removing absorbent gases like oxygen are provided in the intake conduits, provided with intake valves 147, 156, 171, 175, 181, 201, 205, and in the exhaust conduits, provided with exhaust valves 148, 157, 172, 176, 182, 202, 206.

Furthermore, the gas in gas replacement chambers 174, 204 must be replaced every time the reticle or wafer is replaced. For example, when replacing a reticle R, door 177 is opened and a reticle from reticle stocker 210 is transported into gas replacement chamber 174. Door 177 is then closed and gas replacement chamber 174 is filled with a specific gas. Then door 173, is opened and the reticle is mounted on reticle stage RS. When replacing a wafer W, door 207 is opened and the wafer is transported into gas replacement chamber 204. Door 207 is then closed and gas replacement chamber 204 is filled with a specific gas. Subsequently, door 203 is opened and the wafer is mounted on wafer holder 20. Furthermore, reticle outward transport and wafer outward transport are performed in the reverse order. When replacing the gas in gas replacement chambers 174, 204, the pressure of the atmosphere inside the gas replacement chamber is reduced. The specific gas may then be supplied from the intake valve.

There is a possibility that the gas replaced by gas replacement chambers 174, 204 might contaminate casings 170, 200. There is also a strong possibility that a large amount of absorbent gas like oxygen might contaminate the gas in gas replacement chambers 174, 204. Accordingly, it is preferable to replace the gas in casings 170, 200 at the same time as replacing the gas in gas replacement chambers 174, 204. It is also preferable to fill the casings and gas replacement chambers ahead of time with a specific gas at a pressure higher than the pressure of the external atmosphere.

The following explains several numerical Working Examples of the projection optical system of the exposure apparatus according to the present invention. Working Example 1 to Working Example 3 are suited to projection optical system PE1 of the first embodiment of the present invention shown in FIG. 1 to FIG. 3. Working Example 4 and Working Example 5 are suited to projection optical system PE2 of the second embodiment of the present invention shown in FIG. 4. An aspheric surface is indicated by the symbol ✳.

WORKING EXAMPLE 1

Figure 5:
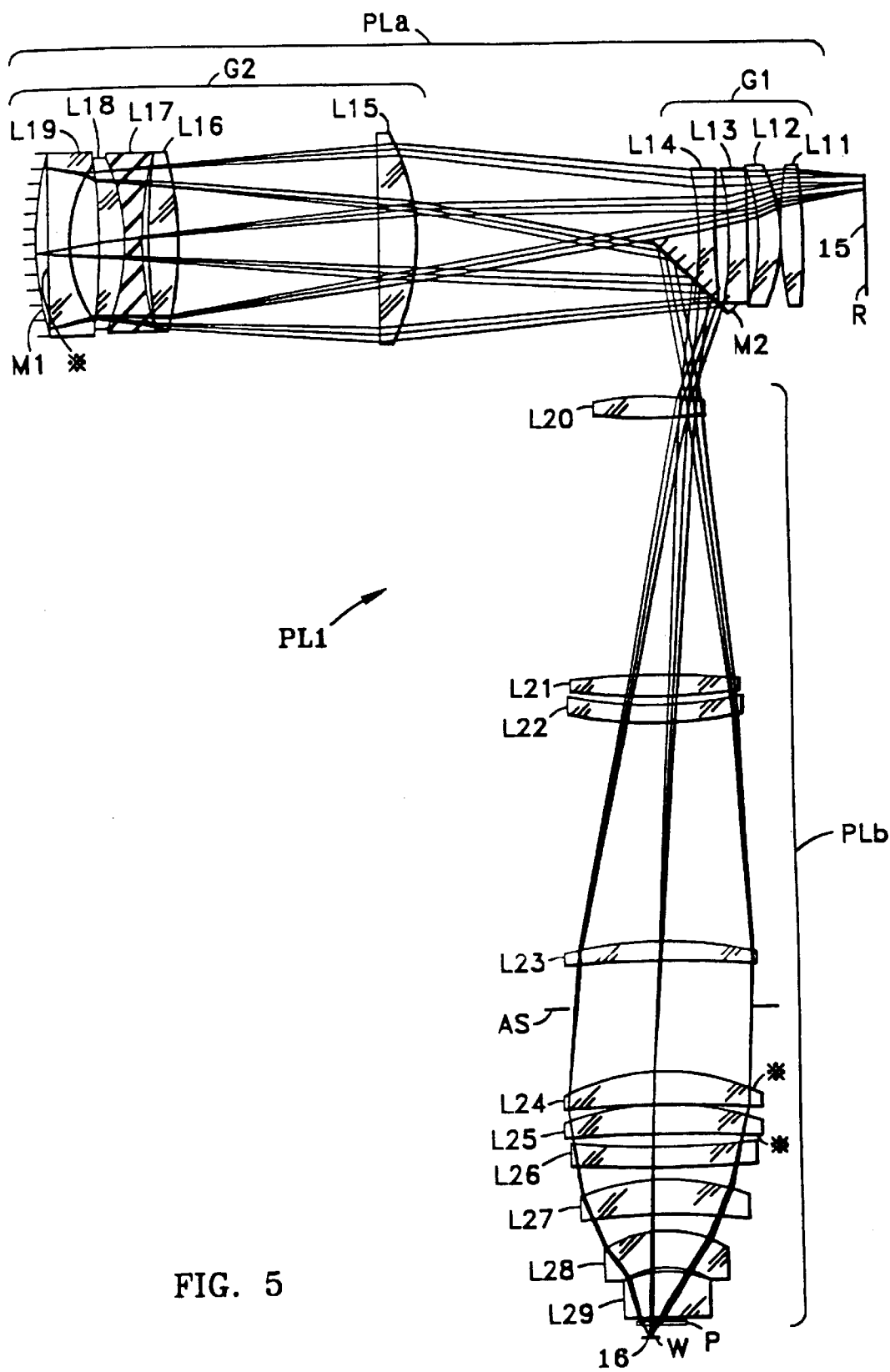
FIG. 5 is a schematic optical diagram of the projection optical system according to Working Example 1.

FIG. 5 is a schematic optical diagram of the projection optical system according to Working Example 1. Projection optical system PL1 of Working Example 1 is optimized for an exposure energy beam having wavelength λ=193.40 nm and a wavelength width (FWHM) of ±0.01 nm (±10 pm).

With reference to FIG. 5, projection optical system PL1 is provided with a first imaging system PLa that includes concave mirror M1 and that forms an intermediate image of reticle R, a second imaging system PLb that reimages this intermediate image onto wafer W with a predetermined reduction magnification, and folding mirror M2 arranged between first imaging system PLa and second imaging system PLb. Furthermore, although there is only one folding mirror in projection optical system PL1, a folding mirror may also be provided in second imaging system PLb, as shown in FIG. 2.

First imaging system PLa has first lens group G1 arranged most reticle-wise, second lens group G2 and concave mirror M1. Lens groups G1 and G2 and the concave mirror are positioned so that the exposure energy beam that travels from the illumination optical system via reticle R sequentially passes through first lens group G1 and second lens group G2 and reaches concave mirror M1. The exposure energy beam reflected by the concave mirror then proceeds to folding mirror M2 after passing through second lens group G2.

First lens group G1 has, in order from the reticle R side, biconvex lens L11, meniscus lens L12 whose convex surface faces the reticle side, negative meniscus lens L13 whose concave surface faces the concave mirror M1 side, and an approximately planoconcave negative lens L14 whose concave surface faces the concave mirror M1 side. Second lens group G2 has, in order from the side farthest from concave mirror M1 (in order from the first lens group G1 side), positive meniscus lens L15 whose convex surface faces the first lens group G1 side, biconvex lens L16, biconcave lens L17, positive meniscus lens L18 whose convex surface faces the first lens group G1 side, and negative meniscus lens L19 whose concave surface faces the first lens group G1 side.

The second imaging system PLb has, in order from the folding mirror M2 side (on the side of the intermediate image formation position), biconvex lens L20, biconvex lens L21, negative meniscus lens L22 whose concave surface faces the intermediate image formation position side, positive meniscus lens L23 whose convex surface faces the intermediate image formation position side, aperture stop AS, two positive meniscus lenses L24, L25 whose convex surfaces face the intermediate image formation position side, negative meniscus lens L26 whose concave surface faces the intermediate image formation position side, positive meniscus lens L27 whose convex surface faces the intermediate image formation position side, positive meniscus lens L28 whose convex surface faces the intermediate image formation position side, and biconvex lens L29.

In projection optical system PL1 according to Working Example 1, biconcave lens L17 in first imaging system PLa is made of barium fluoride ($BaF_2$), and refractive optical elements outside of biconcave lens L17 are made of calcium fluoride (fluorite, $CaF_2$).

In addition, in projection optical system PL1 according to Working Example 1, the lens surface on the concave mirror M1 side of negative meniscus lens L19 in first imaging system PLa, the lens surface on the intermediate image formation position side of positive meniscus lens L24 in second imaging system PLb, and the lens surface on the wafer W side of positive meniscus lens L25 in second imaging system PLb are rotationally symmetric aspherical surfaces. Furthermore, to achieve higher performance and greater compactness, the number of aspherical lens surfaces may be increased, and the reflective surface of concave mirror M1 may also be formed as a rotationally symmetric aspherical surface.

Table 2 below lists the lens data for projection optical system PL1 according to Working Example 1. In Table 2, the left column is the surface number of each optical surface (lens surface and reflective surface), r is the radius of curvature of each optical surface, and d is the surface spacing between each optical surface. In addition, in Table 2, d0 is the distance from the object plane (reticle surface) to the most reticle-wise (object-wise) optical surface, WD is the distance from the most wafer-wise (image-wise) optical surface, β is the lateral magnification of projection optical system PL1 when light enters the projection optical system from the reticle side, and NA is the image-wise numerical aperture. Furthermore, in Table 2, the sign of radius of curvature r is positive when the convexity faces the direction of travel of the light ray, and the sign of surface spacing d reverses after a reflective surface. The units of the radius of curvature r, and the surface spacing d (including d0, and WD) can adopt to, for example, millimeters.

In addition, Table 1 below shows, for calcium fluoride (fluorite, $CaF_2$) and barium fluoride $BaF_2$, the refractive index n(λ) with respect to wavelength λ of the exposure energy beam, and dispersion dn/dλ, which is the amount of change in the refractive index per 1 pm. Furthermore, when the value of dispersion dn/dλ is positive, the refractive index n also increases as wavelength λ lengthens. When the value of dispersion dn/dλ is negative, the refractive index n decreases as wavelength λ lengthens.

TABLE 1

|  | n (193.41 nm) | n (193.40 nm) | n (193.39 nm) | dn/dλ |
|---|---|---|---|---|
| $CaF_2$ | 1.501255 | 1.501265 | 1.501275 | $-1 \times 10^{-6}$ |
| $BaF_2$ | 1.569269 | 1.569285 | 1.569301 | $-1.6 \times 10^{-6}$ |

In addition, an asterisk (*) appended to a surface number in Table 2 indicates that the optical surface is aspherical. The radius of curvature for an aspherical surface in Table 2 and in the Tables below indicates the vertex radius of curvature. For a tangential plane at the vertex of the aspherical surface, the shape of this aspherical surface is expressed by equation (a) below, where the origin is the position in the tangential plane through which the optical axis passes, and z(y) is the displacement, with respect to the vertex of the aspherical surface, in the direction of the optical axis of the aspherical surface at the height y position in the tangential plane when the travel direction of rays is positive.

$$z(y) = \frac{y^2/r}{1+\sqrt{1-(1+\kappa)y^2/r^2}} + Ay^4 + By^6 + Cy^8 + Dy^{10} + Ey^{12} + Fy^{14} + Gy^{16} + Hy^{18} \quad (a)$$

In condition (a), r is the vertex radius of curvature, κ is the conical coefficient, and A, B, C, D, E, F, G and H are the aspherical surface coefficients. In the present working example, conical coefficient κ and aspherical surface coefficients A, B, C and D are listed as aspherical surface data in Table 3, below.

TABLE 2 d0 = 84.572625
WD = 16.000000
|β| = ¼
NA = 0.60

| Surface No. | r | d | Material | |
|---|---|---|---|---|
| 1 | 871.16824 | 27.000000 | Fluorite | L11 |
| 2 | −380.20201 | 1.000000 | | |
| 3 | 224.26749 | 25.000000 | Fluorite | L12 |
| 4 | 258.64591 | 15.740207 | | |
| 5 | 1940.07786 | 20.000000 | Fluorite | L13 |
| 6 | 387.03193 | 17.466259 | | |
| 7 | −36301.92312 | 22.948015 | Fluorite | L14 |

TABLE 2-continued d0 = 84.572625
WD = 16.000000
|β| = ¼
NA = 0.60

| Surface No. | r | d | Material | |
|---|---|---|---|---|
| 8 | 517.35208 | 349.972078 | | |
| 9 | 352.71528 | 45.000000 | Fluorite | L15 |
| 10 | 13713.82681 | 271.046061 | | |
| 11 | 410.96935 | 40.000000 | Fluorite | L16 |
| 12 | −1038.81277 | 10.252945 | | |
| 13 | −428.47645 | 20.000000 | Barium fluoride | L17 |
| 14 | 206.04444 | 1.000000 | | |
| 15 | 210.50640 | 40.000000 | Fluorite | L18 |
| 16 | 2181.36614 | 35.003163 | | |
| 17 | −223.34109 | 25.000000 | Fluorite | L19 |
| *18 | −12905.57320 | 20.674820 | | |
| 19 | −375.59609 | −20.674820 | M1 | |
| *20 | −12905.57320 | −25.000000 | Fluorite | L19 |
| 21 | −223.34109 | −35.003163 | | |
| 22 | 2181.36614 | −40.000000 | Fluorite | L18 |
| 23 | 210.50640 | −1.000000 | | |
| 24 | 206.04444 | −20.000000 | Barium fluoride | L17 |
| 25 | −428.47645 | −10.252945 | | |
| 26 | −1038.81277 | −40.000000 | Fluorite | L16 |
| 27 | 410.96935 | −271.046061 | | |
| 28 | 13713.82681 | −45.000000 | Fluorite | L15 |
| 29 | 352.71528 | −288.378273 | | |
| 30 | ∞ | 219.962086 | M2 | |
| 31 | 676.35050 | 24.000000 | Fluorite | L20 |
| 32 | −874.40286 | 369.722215 | | |
| 33 | 1254.34163 | 28.000000 | Fluorite | L21 |
| 34 | −976.80660 | 14.522645 | | |
| 35 | −412.59450 | 22.000000 | Fluorite | L22 |
| 36 | −621.46447 | 311.589802 | | |
| 37 | 586.39212 | 30.000000 | Fluorite | L23 |
| 38 | 3646.08543 | 77.860846 | | |
| 39 | ∞ | 76.973258 | AS | |
| *40 | 258.44076 | 40.426938 | Fluorite | L24 |
| 41 | 1223.19093 | 0.200000 | | |
| 42 | 302.72739 | 45.000000 | Fluorite | L25 |
| *43 | 5772.33218 | 15.976633 | | |
| 44 | −1486.32264 | 25.000000 | Fluorite | L26 |
| 45 | −3965.41128 | 15.769952 | | |
| 46 | 252.90031 | 55.697827 | Fluorite | L27 |
| 47 | 951.03836 | 19.992659 | | |
| 48 | 152.49590 | 47.403052 | Fluorite | L28 |
| 49 | 88.34801 | 8.850248 | | |
| 50 | 106.89426 | 66.198893 | Fluorite | L29 |
| 51 | −1279.55924 | 1.000000 | | |
| 52 | ∞ | 6.000000 | Fluorite | P |
| 53 | ∞ | (WD) | | |

TABLE 3

Aspherical Surface Data for Surface No. 18 (Surface No. 20)

κ = 0.000000
A = −0.292039 × 10⁻⁰⁸  B = −0.412188 × 10⁻¹³
C = 0.125546 × 10⁻¹⁷  D = −0.558880 × 10⁻²²

Aspherical Surface Data for Surface No. 40

κ = −0.792468
A = −0.163748 × 10⁻⁰⁸  B = −0.374334 × 10⁻¹³
C = −0.261430 × 10⁻¹⁸  D = −0.575093 × 10⁻²²

Aspherical Surface Data for Surface No. 43

κ = 0.000000
A = 0.539237 × 10⁻⁰⁸  B = −0.731731 × 10⁻¹³
C = −0.182744 × 10⁻¹⁷  D = 0.132937 × 10⁻²²

Figure 6A:
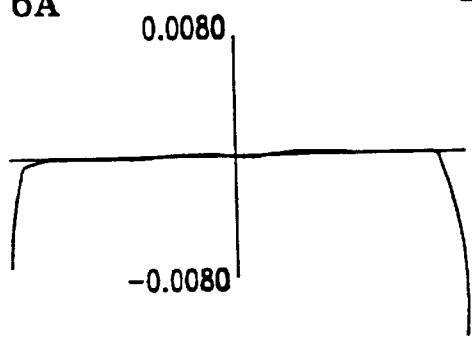
FIGS. 6A–6F are aberration plots of the projection optical system according to Working Example 1 of FIG. 5.
Figure 6D:
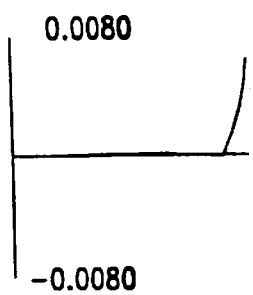
Figure 6B:
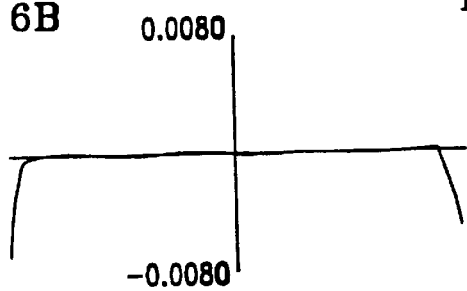
Figure 6E:
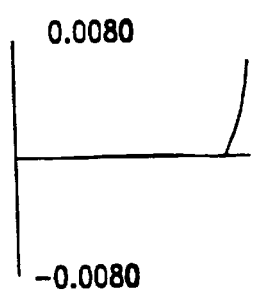
Figure 6C:
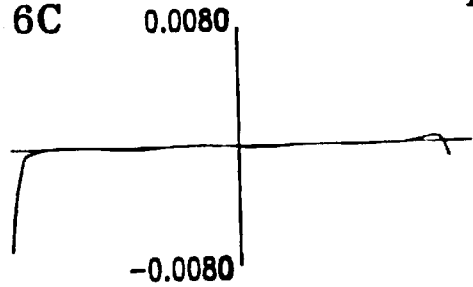
Figure 6F:
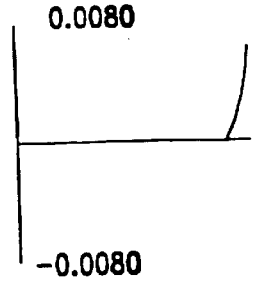

FIGS. 6A–6E are lateral aberration plots for projection optical system PL1 according to Working Example 1. FIG. 6A is a lateral aberration plot in the meridional direction at image height Y=18, FIG. 6B is a lateral aberration plot in the meridional direction at image height Y=16, FIG. 6C is a lateral aberration plot in the meridional direction at image height Y=14, FIG. 6D is a lateral aberration plot in the sagittal direction at image height Y=18, FIG. 6E is a lateral aberration plot in the sagittal direction at image height Y=16, and FIG. 6F is a lateral aberration plot in the sagittal direction at image height Y=14. In addition, in each of the lateral aberration plots in FIG. 6A to FIG. 6F, the solid line is the aberration curve at wavelength λ=193.40 nm, the broken line is the aberration curve at wavelength λ=193.41 nm, and the chain line is the aberration curve at wavelength λ=193.39 nm.

As can be seen from each of the aberration plots in FIGS. 6A–6E, aberrations are satisfactorily corrected in projection optical system PL1 according to Working Example 1. In particular, chromatic aberration with respect to an exposure energy beam having a wavelength width of ±10 pm is satisfactorily corrected. In addition, projection optical system PL1 of Working Example 1 uses only fluoride crystals as the dioptric optical members, and has the advantage that fluctuations in irradiation are not easily produced even at wavelengths under 200 nm. Accordingly, by assembling projection optical system PL1 according to Working Example 1 in an exposure apparatus, an extremely fine pattern can be transferred onto a wafer even if the light source is inadequately narrowbanded.

WORKING EXAMPLE 2

Figure 7:
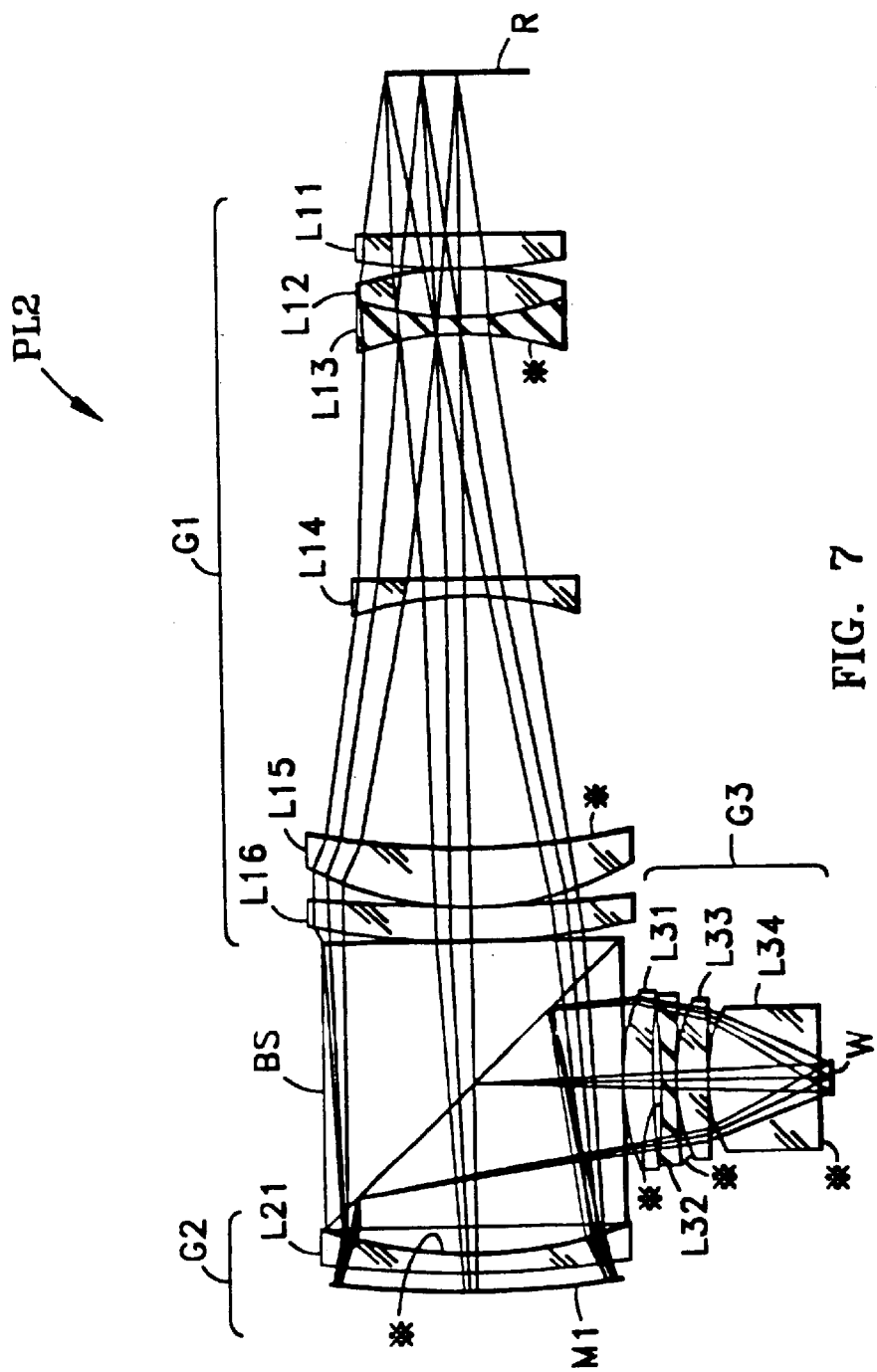
FIG. 7 is a schematic optical diagram of the projection optical system according to Working Example 2.

FIG. 7 is a schematic optical diagram of a projection optical system PL2 according to Working Example 2. Projection optical system PL2 of Working Example 2 is optimized for an exposure energy beam having wavelength λ=193.40 nm and a wavelength width (FWHM) of ±0.01 nm (±10 pm).

Unlike the projection optical system PL1 according to Working Example 1 in FIG. 5, projection optical system PL2 does not form an intermediate image. Rather, projection optical system PL2 has a first lens group G1 with positive refractive power, beam splitter BS, second lens group G2 that includes concave mirror M1, and third lens group G3 having positive refractive power. Projection optical system PL2 does not have a folding mirror. However, a folding mirror may be provided in first lens group G1 to make the arrangement of reticle R and wafer W parallel. In addition, either a half mirror (half prism) that divides the amplitude or a polarizing beam splitter that separates polarized light can be used as beam splitter BS. If a polarizing beam splitter is used, it is preferable to provided a ¼ wavelength plate in the optical path between at least beam splitter BS and concave mirror M1. It is further preferable to provide a ¼ wavelength plate in the optical path between beam splitter BS and wafer W.

In projection optical system PL2, each optical member is positioned so that the exposure energy beam that travels from the illumination optical system via reticle R passes sequentially through first lens group G1, beam splitter BS, second lens group G2 that includes concave mirror M1, beam splitter BS, and third lens group G3, and then reaches wafer W (i.e., the image plane). Furthermore, beam splitter BS is arranged so that it transmits the exposure energy beam that proceeds from first lens group G1 to concave mirror M1 (second lens group G2), and reflects the exposure energy beam that proceeds from concave mirror M1 (second lens group G2) to third lens group G3. Nevertheless, beam splitter BS can also be arranged so that it reflects the exposure energy beam that proceeds from first lens group G1 to concave mirror M1 (second lens group G2), and transmits the exposure energy beam that proceeds from concave mirror M1 (second lens group G2) to third lens group G3.

With continuing reference to FIG. 7, first lens group G1 is provided with, in order from the reticle R side, positive meniscus lens L11 whose concave surface faces the reticle R side, biconvex lens L12, biconcave lens L13, biconcave lens L14, and two positive meniscus lenses L15, L16 whose concave surfaces face the reticle R side.

Second lens group G2 is provided with concave mirror M1, and negative meniscus lens L21 arranged between concave mirror M1 and beam splitter BS and whose concave surface faces the beam splitter BS side.

Third lens group G3 is provided with, in order from the beam splitter BS side, positive meniscus lens L31 whose convex surface faces the beam splitter BS side, biconcave lens L32, and two positive meniscus lenses L33, L34 whose convex surfaces face the beam splitter BS side.

In projection optical system PL2, biconcave lens L13 in first lens group G1 and biconcave lens L32 in third lens group G3 are made of barium fluoride (BaF$_2$), and refractive optical elements (lenses and beam splitters) outside of biconcave lenses L13, L32 are made of calcium fluoride (fluorite, CaF$_2$).

It is preferable to construct projection optical system PL2 so that the (111) face of the crystal is perpendicular to the light beam, to reduce the effect of strain on the crystal in a cube-type beam splitter made of a fluoride crystal. Specifically, it is preferable either to make it so that the incident surface on the first lens group G1 side of cube-type beam splitter BS (incident/exit surface on the concave mirror M1 side of beam splitter BS) is parallel to the (111) face of the fluorite crystal, or so that the exit surface on the third lens group G3 side of cube-type beam splitter BS is parallel to the (111) face of the fluorite crystal. Thereby, the effect of strain on the fluorite is reduced, since the exposure energy beam that passes through cube-type beam splitter BS is perpendicular to the (111) face. Furthermore, it is preferable to constitute beam splitter BS so that, among the light beams that pass through beam splitter BS, the light beam that passes through the folding surface (semitransparent surface, polarized light separation surface) is substantially perpendicular to the (111) face of the crystalline material. This is because, in view of the length of the optical path that passes through beam splitter BS, the light beam that passes through the folding surface (semitransparent surface, polarized light separation surface) is longer than the light beam reflected by the folding surface, and because it is more subject to the effect strain.

In first lens group G1 of projection optical system PL2, the lens surface on the beam splitter BS side of biconcave lens L13, the lens surface on the beam splitter side of biconcave lens L14, and the lens surface on the reticle side of positive meniscus lens L15 are rotationally symmetric aspherical surfaces. In second lens group G2, the reflective surface of concave mirror M1 and the lens surface on the beam splitter BS side of negative meniscus lens L21 are rotationally symmetric aspherical surfaces. Furthermore, in third lens group G3, the lens surface on the beam splitter side of biconcave lens L32, the lens surface on the beam splitter BS side of positive meniscus lens L33, and the lens surface on the wafer W side of positive meniscus lens L34 are rotationally symmetric aspherical surfaces. To further increase performance and compactness, the number of aspherical lens surfaces may be increased. In addition, the reflective surface of concave mirror M1 may also be spherical to simplify manufacturing.

Table 4 below lists the lens data for projection optical system PL2 according to Working Example 2. The parameters for optical specifications r, d, d0, WD, β and NA in Table 4 are the same as those in Table 2 of Working Example 1. In addition, refractive index n(λ), with respect to wavelength λ of the exposure energy beam, and dispersion dn/dλ for calcium fluoride (fluorite, $CaF_2$) and barium fluoride $BaF_2$ are the same as in the above Table 1.

TABLE 4 d0 = 179.836818
WD = 10.000001
|β| = ¼
NA = 0.60

| Surface No. | r | d | Material | |
|---|---|---|---|---|
| 1 | −10250.79431 | 30.000000 | Fluorite | L11 |
| 2 | −717.04267 | 2.438719 | | |
| 3 | 383.49011 | 51.000000 | Barium fluoride | L12 |
| 4 | −285.17312 | 1.469515 | | |
| 5 | −280.61345 | 18.000000 | Fluorite | L13 |
| *6 | 355.18016 | 268.889080 | | |
| 7 | −2851.14242 | 20.000000 | Fluorite | L14 |
| *8 | 511.82390 | 272.939367 | | |
| *9 | −869.71671 | 65.000000 | Fluorite | L15 |
| 10 | −327.57872 | 1.173164 | | |
| 11 | −1190.29881 | 40.000000 | Fluorite | L16 |
| 12 | −642.56168 | 1.000000 | | |
| 13 | ∞ | 320.000000 | Fluorite | BS |
| 14 | ∞ | 40.965577 | | |
| *15 | −347.83226 | 20.000000 | Fluorite | L21 |
| 16 | −800.36628 | 20.432301 | | |
| *17 | −638.57219 | −20.432301 | | M1 |
| 18 | −800.36628 | −20.000000 | Fluorite | L21 |
| *19 | −347.83226 | −40.965577 | | |
| 20 | ∞ | −160.000000 | Fluorite | BS |
| 21 | ∞ | 160.000000 | Fluorite | (Folding Surface) |
| 22 | ∞ | 1.000000 | | |
| 23 | 250.00239 | 37.000000 | Fluorite | L31 |
| 24 | 1835.59656 | 6.000000 | | |
| *25 | −5396.89224 | 15.000000 | Barium fluoride | L32 |
| 26 | 1137.05237 | 1.000000 | | |
| *27 | 268.20043 | 30.000000 | Fluorite | L33 |
| 28 | 2667.15845 | 1.000000 | | |
| 29 | 170.52979 | 120.218554 | Fluorite | L34 |
| *30 | 1480.11693 | 10.000001 | | |

TABLE 5

Aspherical Surface Data for Surface No. 6

κ = 0.254955
A = 0.288011 × 10$^{-08}$         B = 0.197315 × 10$^{-13}$
C = 0.306816 × 10$^{-17}$         D = 0.000000 × 10$^{+00}$

Aspherical Surface Data for Surface No. 8

κ = −0.112951
A = −0.865512 × 10$^{-10}$        B = −0.671998 × 10$^{-15}$
C = −0.670423 × 10$^{-18}$        D = 0.000000 × 10$^{+00}$

Aspherical Surface Data for Surface No. 9

κ = −0.925654
A = −0.454939 × 10$^{-09}$        B = −0.445290 × 10$^{-14}$
C = −0.376839 × 10$^{-19}$        D = 0.000000 × 10$^{+00}$

Aspherical Surface Data for Surface No. 15 (Surface No. 19)

κ = 0.053630
A = 0.869858 × 10$^{-09}$         B = 0.240907 × 10$^{-14}$
C = 0.229343 × 10$^{-18}$         D = 0.101423 × 10$^{-23}$

Aspherical Surface Data for Surface No. 17 (Reflective Surface)

κ = −0.111428
A = 0.354531 × 10$^{-09}$         B = 0.376023 × 10$^{-15}$
C = 0.715525 × 10$^{-19}$         D = 0.000000 × 10$^{+00}$

TABLE 5-continued

Aspherical Surface Data for Surface No. 25

κ = 172.768780
A = 0.381884 × 10$^{-09}$         B = −0.859147 × 10$^{-13}$
C = 0.345931 × 10$^{-17}$         D = −0.628469 × 10$^{-22}$

Aspherical Surface Data for Surface No. 27

κ = 0.129701
A = 0.353753 × 10$^{-08}$         B = 0.154211 × 10$^{-12}$
C = 0.412201 × 10$^{-18}$         D = −0.583718 × 10$^{-22}$

Aspherical Surface Data for Surface No. 30

κ = 2095.961373
A = 0.173519 × 10$^{-06}$         B = −0.405184 × 10$^{-09}$
C = 0.475715 × 10$^{-12}$         D = −0.314679 × 10$^{-15}$

Figure 8A:
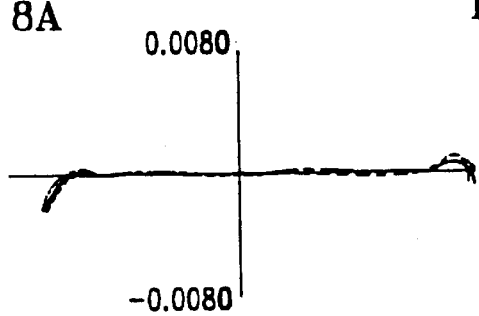
FIGS. 8A–8F are aberration plots of the projection optical system according to Working Example 2 of FIG. 7.
Figure 8D:
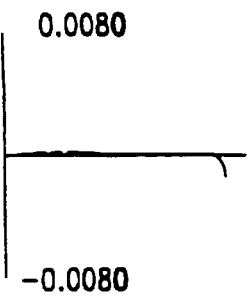
Figure 8B:
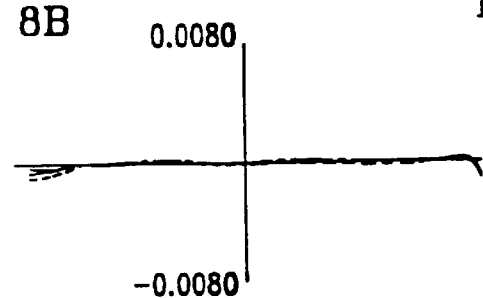
Figure 8E:
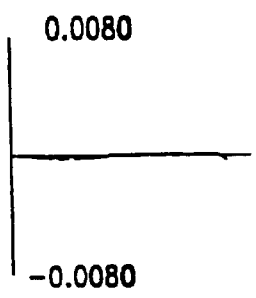
Figure 8C:
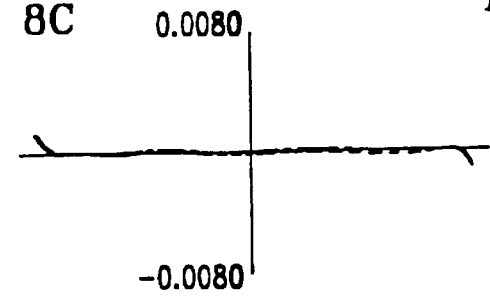
Figure 8F:
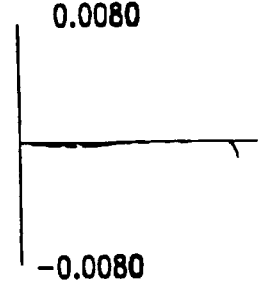

FIGS. 8A–8E are lateral aberration plots for wafer W of the projection optical system according to Working Example 2. FIG. 8A is a lateral aberration plot in the meridional direction at image height Y=18, FIG. 8B is a lateral aberration plot in the meridional direction at image height Y=16, FIG. 8C is a lateral aberration plot in the meridional direction at image height Y=14, FIG. 8D is a lateral aberration plot in the sagittal direction at image height Y=18, FIG. 8E is a lateral aberration plot in the sagittal direction at image height Y=16, and FIG. 8F is a lateral aberration plot in the sagittal direction at image height Y=14. In addition, in each of the lateral aberration plots in FIG. 8A to FIG. 8F, the solid line is the aberration curve at wavelength λ=193.40 nm, the broken line is the aberration curve at wavelength λ=193.41 nm, and the chain line is the aberration curve at wavelength λ=193.39 nm.

As can be seen from each of the aberration plots in FIGS. 8A–8F, aberrations are satisfactorily corrected in projection optical system PL2. In particular, chromatic aberration with respect to an exposure energy beam having a wavelength width of ±10 pm is satisfactorily corrected. Projection optical system PL2 uses only fluoride crystals as the dioptric optical members, and has the advantage in that fluctuations in irradiation are not easily produced even at wavelengths under 200 nm. Accordingly, by assembling projection optical system PL2 in an exposure apparatus, an extremely fine pattern can be transferred onto a wafer even if the light source is inadequately narrowbanded.

WORKING EXAMPLE 3

Figure 9:
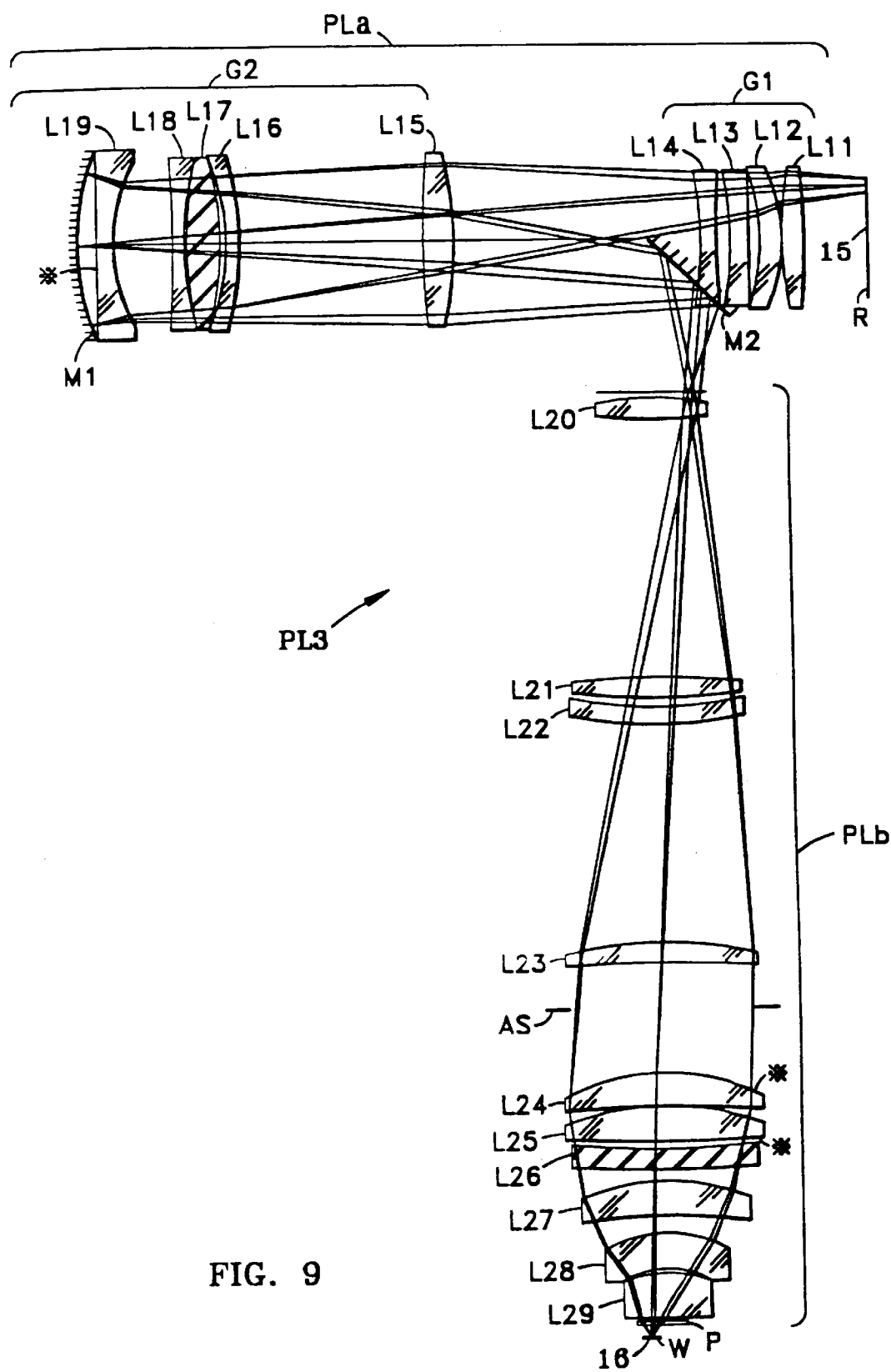
FIG. 9 is a schematic optical diagram of the projection optical system according to Working Example 3.

FIG. 9 is a schematic optical diagram of a projection optical system PL3 according to Working Example 3. Projection optical system PL3 is optimized for an exposure energy beam having wavelength λ=193.40 nm and a wavelength width (FWHM) of ±0.01 nm (+10 pm).

In FIG. 9, projection optical system PL3 is provided with first imaging system PLa, second imaging system PLb, and folding mirror M2 the same as Working Example 1. Furthermore, a folding mirror may also be provided in second imaging system PLb.

As in Working Example 1, first imaging system PLa according to Working Example 3 has first lens group G1 arranged most on the reticle R side, and second lens group G2 and concave mirror M1. Lens groups G1 and G2 and the concave mirror are positioned so that the exposure energy beam that travels from the illumination optical system via reticle R passes sequentially through first lens group G1 and second lens group G2 and reaches concave mirror M1, and so that the exposure energy beam reflected by the concave mirror proceeds to folding mirror M2 after passing through second lens group G2.

First lens group G1 has, in order from the reticle R side, biconvex lens L11, meniscus lens L12 whose convex surface faces the reticle side, biconcave lens L13, and negative meniscus lens L14 whose concave surface faces the concave mirror M1 side. Second lens group G2 has, in order from the side farthest from concave mirror M1 (in order from the first lens group G1 side), biconvex lens L15, negative meniscus lens L16 whose concave surface faces the concave mirror M1 side, biconvex lens L17, biconcave lens L18, and negative meniscus lens L19 whose concave surface faces the first lens group G1 side.

Second imaging system PLb has, in order from the folding mirror M2 side (on the side of the intermediate image formation position), biconvex lens L20, biconvex lens L21, negative meniscus lens L22 whose concave surface faces the intermediate image formation position side, positive meniscus lens L23 whose convex surface faces the intermediate image formation position side, aperture stop AS, positive meniscus lens L24 whose convex surfaces faces the intermediate image formation position side, biconvex lens L25, biconcave lens L26, positive meniscus lens L27 whose convex surface faces the intermediate image formation position side, negative meniscus lens L28 whose concave surface faces the intermediate image formation position side, and biconvex lens L29.

In projection optical system PL3, biconvex lens L17 in first imaging system PLa and biconcave lens L26 in second imaging system PLb are made of lithium fluoride (LiF), and refractive optical elements outside of biconvex lens L17 and biconcave lens L26 are made of calcium fluoride (fluorite, $CaF_2$).

In addition, in projection optical system PL3, the lens surface on the concave mirror M1 side of negative meniscus lens L19 in first imaging system PLa, the lens surface on the intermediate image formation position side of positive meniscus lens L24 in second imaging system PLb, and the lens surface on the wafer W side of positive meniscus lens L25 in second imaging system PLb are rotationally symmetric aspherical surfaces. To achieve higher performance and greater compactness, the number of aspherical lens surfaces may be increased, and the reflective surface of concave mirror M1 may also be made a rotationally symmetric aspherical surface.

Table 7 below lists the lens data for projection optical system PL3 according to Working Example 3. The parameters for optical specifications r, d, d0, WD, β and NA in Table 7 are the same as those in Table 2 in Working Example 1. In addition, refractive index n(λ), with respect to wavelength λ of the exposure energy beam, and dispersion dn/dλ, which is the amount of change in the refractive index per 1 pm of wavelength, are shown for lithium fluoride LiF in Table 6 below.

TABLE 6

| | n(193.41 nm) | n(193.40 nm) | n(193.39 nm) | dn/dγ |
|---|---|---|---|---|
| LiF | 1.441811 | 1.441817 | 1.441824 | $-0.65 \times 10^{-6}$ |

TABLE 7 d0 = 94.886386
WD = 16.000000
|β| = ¼
NA = 0.60

| Surface No. | r | d | Material | |
|---|---|---|---|---|
| 1 | 650.97957 | 27.000000 | Fluorite | L11 |
| 2 | -347.82508 | 1.000000 | | |

TABLE 7-continued d0 = 94.886386
WD = 16.000000
|β| = ¼
NA = 0.60

| Surface No. | r | d | Material | |
|---|---|---|---|---|
| 3 | 215.02562 | 25.000000 | Fluorite | L12 |
| 4 | 267.11861 | 16.241393 | | |
| 5 | -1191.93512 | 20.000000 | Fluorite | L13 |
| 6 | 376.62657 | 16.421979 | | |
| 7 | 2423.98207 | 19.469031 | Fluorite | L14 |
| 8 | 481.45386 | 340.747306 | | |
| 9 | 543.50711 | 45.000000 | Fluorite | L15 |
| 10 | -4414.45734 | 293.563955 | | |
| 11 | 555.10097 | 20.000000 | Fluorite | L16 |
| 12 | 320.88231 | 7.000000 | | |
| 13 | 366.76657 | 47.000000 | Lithium fluoride | L17 |
| 14 | -566.13830 | 6.046749 | | |
| 15 | -414.83076 | 20.000000 | Fluorite | L18 |
| 16 | 2344.01933 | 100.862326 | | |
| 17 | -242.79738 | 25.000000 | Fluorite | L19 |
| *18 | -8238.60039 | 25.961769 | | |
| 19 | -397.44578 | -25.961796 | | M1 |
| *20 | -8238.60039 | -25.000000 | Fluorite | L19 |
| 21 | -242.79738 | -100.862326 | | |
| 22 | 2344.01933 | -20.000000 | Fluorite | L18 |
| 23 | -414.83076 | -6.046749 | | |
| 24 | -566.13830 | -47.000000 | Lithium fluoride | L17 |
| 25 | 366.76657 | -7.000000 | | |
| 26 | 320.88231 | -20.000000 | Fluorite | L16 |
| 27 | 555.10097 | -293.563955 | | |
| 28 | -4414.45734 | -45.000000 | Fluorite | L15 |
| 29 | 543.50711 | -288.623356 | | |
| 30 | ∞ | 210.68423 | | M2 |
| 31 | 764.66537 | 24.000000 | Fluorite | L20 |
| 32 | -1086.13236 | 344.326892 | | |
| 33 | 752.57340 | 28.000000 | Fluorite | L21 |
| 34 | -847.85250 | 12.261977 | | |
| 35 | -411.95512 | 22.000000 | Fluorite | L22 |
| 36 | -911.01214 | 292.015674 | | |
| 37 | 536.03324 | 30.000000 | Fluorite | L23 |
| 38 | 2371.38066 | 193.698930 | | |
| 39 | ∞ | 70.000000 | | AS |
| *40 | 257.70928 | 40.426938 | Fluorite | L24 |
| 41 | 695.08658 | 0.200000 | | |
| 42 | 260.63720 | 48.000000 | Fluorite | L25 |
| *43 | -2292.01101 | 16.503311 | | |
| 44 | -1115.57682 | 25.000000 | Lithium fluoride | L26 |
| 45 | 3092.66092 | 15.075726 | | |
| 46 | 234.20418 | 52.919955 | Fluorite | L27 |
| 47 | 1020.54167 | 19.298313 | | |
| 48 | 161.80016 | 47.293104 | Fluorite | L28 |
| 49 | 98.97930 | 7.175193 | | |
| 50 | 125.35073 | 65.602116 | Fluorite | L29 |
| 51 | -965.45665 | 1.000000 | | |
| 52 | ∞ | 6.000000 | Fluorite | P |
| 53 | ∞ | (WD) | | |

TABLE 8

Aspherical Surface Data for Surface No. 18 (Surface No. 20)

κ = 0.000000
A = $-0.268228 \times 10^{-08}$        B = $0.958987 \times 10^{-14}$
C = $-0.586009 \times 10^{-19}$        D = $-0.117463 \times 10^{-23}$ Aspherical Surface Data for Surface No. 40

κ = -0.806915
A = $-0.182595 \times 10^{-08}$        B = $-0.330691 \times 10^{-13}$
C = $-0.682492 \times 10^{-18}$        D = $-0.150418 \times 10^{-22}$ TABLE 8-continued Asphencal Surface Data for Surface No. 43

κ = 0.000000
A = 0.480787 × 10$^{-08}$     B = -0.934126 × 10$^{-13}$
C = 0.711029 × 10$^{-18}$     D = 0.185034 × 10$^{-22}$

Figure 10A:
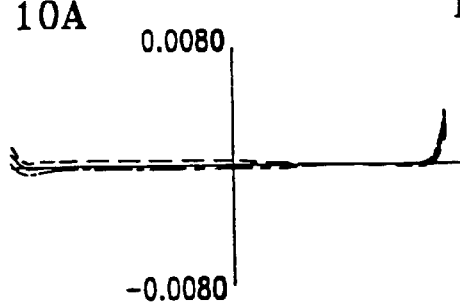
FIGS. 10A–10F are aberration plots of the projection optical system according to Working Example 3 of FIG. 9.
Figure 10D:
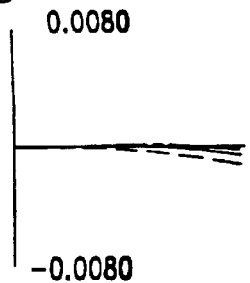
Figure 10B:
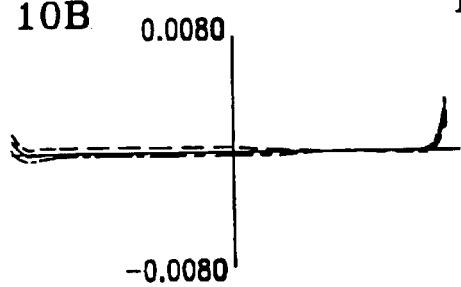
Figure 10E:
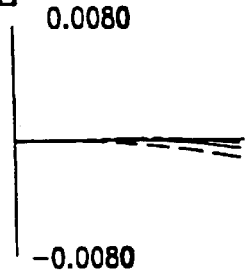
Figure 10C:
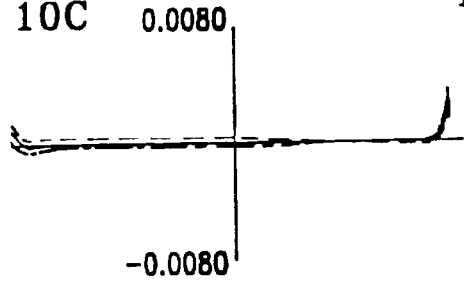
Figure 10F:
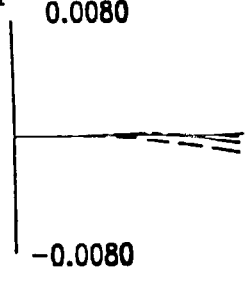

FIGS. 10A–10E are lateral aberration plots for projection optical system PL3. FIG. 10A is a lateral aberration plot in the meridional direction at image height Y=18, FIG. 10B is a lateral aberration plot in the meridional direction at image height Y=16, FIG. 10C is a lateral aberration plot in the meridional direction at image height Y=14, FIG. 10D) is a lateral aberration plot in the sagittal direction at image height Y=18, FIG. 10E is a lateral aberration plot in the sagittal direction at image height Y=16, and FIG. 10F is a lateral aberration plot in the sagittal direction at image height Y=14. In each of the lateral aberration plots in FIG. 10A to FIG. 10F, the solid line is the aberration curve at wavelength λ=193.40 nm, the broken line is the aberration curve at wavelength λ=193.41 nm, and the chain line is the aberration curve at wavelength λ=193.39 nm.

As can be seen from each of the aberration plots 10A–10E, aberrations are satisfactorily corrected in the projection optical system according to Working Example 3. In particular, chromatic aberration with respect to an exposure energy beam having a wavelength width of ±10 pm is satisfactorily corrected. Projection optical system PL3 uses only fluoride crystals as the dioptric optical members, and has the advantage in that fluctuations in irradiation are not easily produced even at wavelengths under 200 nm. Accordingly, by assembling projection optical system PL3 in an exposure apparatus, an extremely fine pattern can be transferred onto a wafer even if the light source is inadequately narrowbanded.

WORKING EXAMPLE 4

Figure 11A:
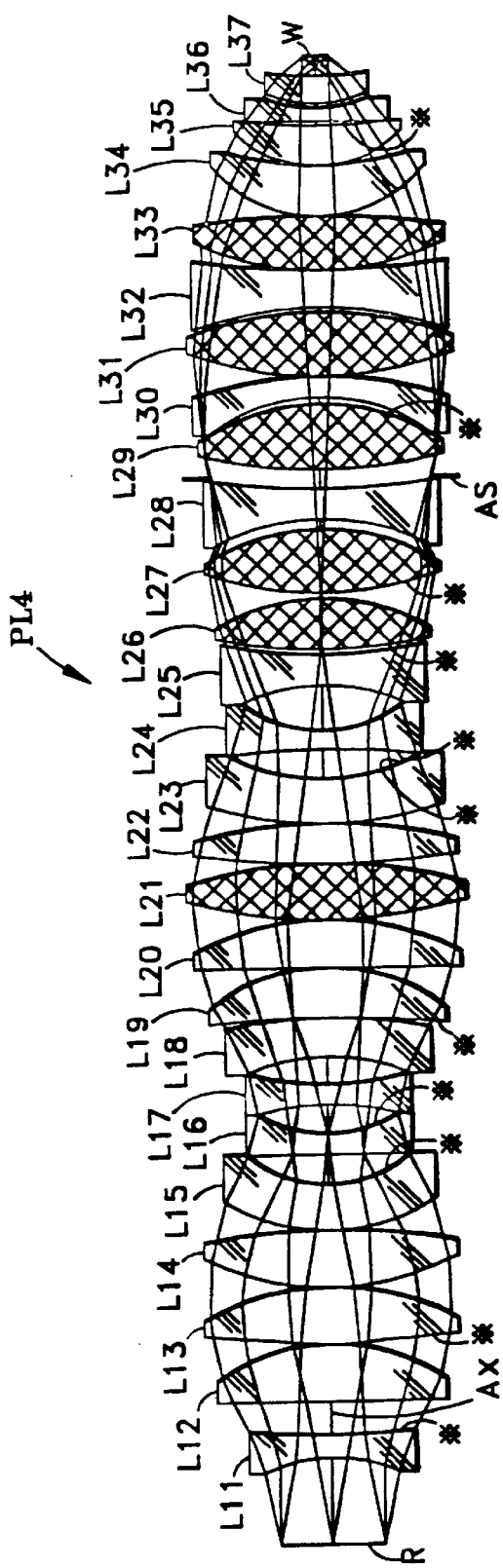
FIG. 11A is schematic optical diagram of the projection optical system according to Working Example 4.

FIG. 11A is a schematic optical diagram of a projection optical system PL4 according to Working Example 4. Projection optical system PL4 of Working Example 4 is optimized for an exposure energy beam having wavelength λ=157.624 nm and a wavelength width (FWHM) of ±0.5 pm (±0.0005 nm).

In FIG. 11A, projection optical system PL4 comprises a plurality of lens elements arranged linearly along optical axis Ax. Projection optical system PL4 has, in order from the reticle R side, biconcave lens L11, three biconvex lenses L12, L13, L14, two negative meniscus lenses L15, L16 whose concave surfaces face the wafer W side, biconcave lens L17, negative meniscus lens L18 whose concave surface faces the reticle R side, positive meniscus lens L19 whose concave surface faces the reticle R side, three biconvex lenses L20, L21, L22, negative meniscus lens L23 whose concave surface faces the wafer W side, two biconcave lenses L24, L25, two biconvex lenses L26, L27, biconcave lens L28, aperture stop AS, biconvex lens L29, negative meniscus lens L30 whose concave surface faces the reticle R side, biconvex lens L31, biconcave lens L32, biconvex lens L33, two positive meniscus lenses L34, L35 whose concave surfaces face the wafer W side, negative meniscus lens L36 whose concave surface faces the wafer W side, and positive meniscus lens L37 whose concave surface faces the wafer W side.

In projection optical system PL4, positive lenses L21, L26, L27, L29, L31, L33 are made of lithium fluoride (LiF), and lenses (refractive optical elements) outside of positive lenses L21, L26, L27, L29, L31, L33 are made of calcium fluoride (fluorite, $CaF_2$).

In projection optical system PL4, the lens surface on the wafer W side of negative lens L11, the lens surface on the reticle R side of positive lens L13, the lens surface on the wafer W side of negative lens L15, the lens surface on the wafer W side of negative lens L16, the lens surface on the wafer W side of negative lens L23, the lens surface on the reticle R side of negative lens L24, the lens surface on the wafer W side of negative lens L25, the lens surface on the reticle R side of negative lens L30, and the lens surface on the wafer W side of positive lenses L35 are rotationally symmetric aspherical surfaces. To further increase performance and compactness, the number of aspherical lens surfaces may also be increased.

Figure 11B:
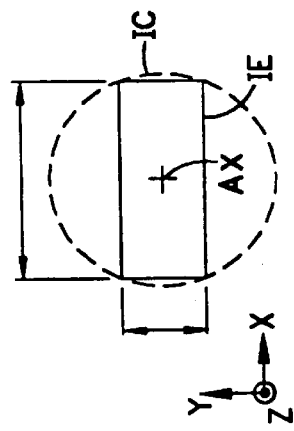
FIG. 11B shows the shape of the exposure region in the image field of the projection optical system of FIG. 11A.

FIG. 11B is a plan view of the relationship between image circle IC and exposure region IE of projection optical system PL4 and also a Working Example 5, discussed below. As shown in FIG. 11B, projection optical system PL4 according to Working Example 4 and projection optical system PL5 Working Example 5 have an image circle IC with a 16.4 nm diameter, and a rectangular exposure region IE having a width of 6.5 mm in the scanning direction (Y direction) and a width of 15 mm in the direction orthogonal to scanning (X direction), within image circle IC. Although exposure region IE in Working Example 4 and Working Example 5 is rectangular, it can be made into various shapes, such as hexagonal, isosceles trapezoidal, scalene trapezoidal, rhombic, square or arcuate, as long as the region is contained in image circle IC.

Table 10 below lists the lens data for projection optical system PL according to Working Example 4. The parameters for optical specifications r, d, d0, WD, β and NA in Table 10 are the same as those in Table 2 in Working Example 1.

In addition, refractive index n(λ), with respect to wavelength λ of the exposure energy beam, and dispersion dn/dλ, which is the amount of change in the refractive index per 1 pm of wavelength, are shown for calcium fluoride (fluorite, $CaF_2$) and lithium fluoride LiF in Table 9 below.

TABLE 9

|  | n (157.6245 nm) | n (157.624 nm) | n (157.6235 nm) | dn/dλ |
|---|---|---|---|---|
| $CaF_2$ | 1.5592368 | 1.559238 | 1.5592392 | -2.4 × 10$^{-6}$ |
| LiF | 1.4858992 | 1.485900 | 1.4859008 | -1.6 × 10$^{-6}$ |

TABLE 10 d0 = 55.0134
WD = 13.6725
|β| = ¼
NA = 0.75

| Surface No. | Radius of Curvature r (mm) | Surface Spacing d (mm) | Material | |
|---|---|---|---|---|
| 1 | -95.68120 | 12.1641 | Fluorite | L11 |
| *2 | 173.25208 | 22.6963 | | |
| 3 | 3267.49862 | 36.4883 | Fluorite | L12 |
| 4 | -125.92446 | 1.0079 | | |
| *5 | 349.17880 | 34.1054 | Fluorite | L13 |
| 6 | -167.00762 | 1.0000 | | |
| 7 | 168.52097 | 34.6434 | Fluorite | L14 |
| 8 | -524.21727 | 1.0908 | | |
| 9 | 132.45374 | 27.5236 | Fluorite | L15 |

TABLE 10-continued $d0 = 55.0134$
$WD = 13.6725$
$|\beta| = \frac{1}{4}$
$NA = 0.75$

| Surface No. | Radius of Curvature r (mm) | Surface Spacing d (mm) | Material | |
|---|---|---|---|---|
| *10 | 64.16275 | 20.7110 | | |
| 11 | 1452.10031 | 12.9460 | Fluorite | L16 |
| *12 | 78.82527 | 21.3753 | | |
| 13 | −182.42797 | 12.1500 | Fluorite | L17 |
| 14 | 177.47117 | 18.1356 | | |
| 15 | −125.62480 | 22.1279 | Fluorite | L18 |
| 16 | −457.24838 | 1.4207 | | |
| *17 | −597.81461 | 33.2038 | Fluorite | L19 |
| 18 | −125.46324 | 1.0000 | | |
| 19 | 8309.27276 | 29.0754 | Fluorite | L20 |
| 20 | −202.66426 | 1.0000 | | |
| 21 | 363.77205 | 33.7749 | Lithium fluoride | L21 |
| 22 | −277.11941 | 1.1938 | | |
| 23 | 480.33249 | 22.5424 | Fluorite | L22 |
| 24 | −585.72897 | 1.2902 | | |
| 25 | 224.18301 | 29.2532 | Fluorite | L23 |
| *26 | 121.00176 | 17.0007 | | |
| *27 | −2572.61582 | 12.7356 | Fluorite | L24 |
| 28 | 91.67295 | 31.1501 | | |
| 29 | −116.20584 | 18.7618 | Fluorite | L25 |
| *30 | 291.88952 | 2.4395 | | |
| 31 | 373.66307 | 31.7541 | Lithium fluoride | L26 |
| 32 | −149.30453 | 2.1638 | | |
| *33 | 218.03538 | 42.6153 | Lithium fluoride | L27 |
| 34 | −137.56852 | 4.4336 | | |
| 35 | −144.61706 | 20.0000 | Fluorite | L28 |
| 36 | 658.12705 | 5.0000 | | |
| 37 | ∞ | 5.0000 | | AS |
| 38 | 301.50853 | 42.5810 | Lithium fluoride | L29 |
| 39 | −150.32227 | 3.3936 | | |
| *40 | −135.39762 | 12.0000 | Fluorite | L30 |
| 41 | −313.24923 | 1.0000 | | |
| 42 | 221.91051 | 41.2552 | Lithium fluoride | L31 |
| 43 | −205.87410 | 1.7016 | | |
| 44 | −196.09660 | 20.0000 | Fluorite | L32 |
| 45 | 356.77528 | 1.0000 | | |
| 46 | 170.21571 | 35.1606 | Lithium fluoride | L33 |
| 47 | −896.09753 | 1.0000 | | |
| 48 | 86.85349 | 32.8922 | Fluorite | L34 |
| 49 | 228.35708 | 1.0408 | | |
| 50 | 82.89042 | 26.1671 | Fluorite | L35 |
| *51 | 594.96633 | 2.2109 | | |
| 52 | 563.74043 | 13.0000 | Fluorite | L36 |
| 53 | 81.77976 | 2.0045 | | |
| 54 | 90.62440 | 17.9449 | Fluorite | L37 |
| 55 | 153.17398 | (WD) | | |

TABLE 11

Aspherical Surface Data for Surface No. 2

$\kappa = 0.00000$
$A = -2.06101 \times 10^{-07}$    $B = 1.00406 \times 10^{-11}$
$C = 3.26543 \times 10^{-15}$    $D = -1.24906 \times 10^{-18}$
$E = 1.77233 \times 10^{-22}$    $F = -1.20316 \times 10^{-26}$ Aspherical Surface Data for Surface No. 5

$\kappa = 0.00000$
$A = -1.20987 \times 10^{-07}$    $B = -5.72817 \times 10^{-12}$
$C = 1.48225 \times 10^{-15}$    $D = -1.04507 \times 10^{-19}$
$E = 1.30629 \times 10^{-24}$    $F = 1.10384 \times 10^{-28}$ TABLE 11-continued Aspherical Surface Data for Surface No. 10

$\kappa = 0.00000$
$A = 8.46920 \times 10^{-08}$    $B = -1.04493 \times 10^{-10}$
$C = -3.32058 \times 10^{-14}$    $D = -5.30752 \times 10^{-18}$
$E = 4.45062 \times 10^{-23}$    $F = -4.95104 \times 10^{-26}$ Aspherical Surface Data for Surface No.12

$\kappa = 0.00000$
$A = -2.74928 \times 10^{-07}$    $B = 1.92175 \times 10^{-10}$
$C = 4.48364 \times 10^{-14}$    $D = 3.23238 \times 10^{-18}$
$E = 1.73078 \times 10^{-21}$    $F = 4.25241 \times 10^{-25}$ Aspherical Surface Data for Surface No. 17

$\kappa = 0.00000$
$A = -5.98724 \times 10^{-08}$    $B = 1.37628 \times 10^{-11}$
$C = 1.45110 \times 10^{-15}$    $D = -2.32803 \times 10^{-19}$
$E = 5.15684 \times 10^{-23}$    $F = -5.58296 \times 10^{-27}$ Aspherical Surface Data for Surface No. 26

$\kappa = 0.00000$
$A = -6.13777 \times 10^{-08}$    $B = -1.21896 \times 10^{-11}$
$C = 1.22783 \times 10^{-15}$    $D = -5.72693 \times 10^{-19}$
$E = -4.77527 \times 10^{-23}$    $F = 2.75975 \times 10^{-27}$ Aspherical Surface Data for Surface No. 27

$\kappa = -2.26316 \times 10^{+03}$
$A = -6.41287 \times 10^{-08}$    $B = 9.39860 \times 10^{-12}$
$C = 1.19937 \times 10^{-15}$    $D = -1.82871 \times 10^{-18}$
$E = 2.99109 \times 10^{-22}$    $F = -2.16040 \times 10^{-26}$ Aspherical Surface Data for Surface No. 30

$\kappa = 0.00000$
$A = -1.68914 \times 10^{-08}$    $B = 1.19350 \times 10^{-11}$
$C = -2.75541 \times 10^{-15}$    $D = 1.34646 \times 10^{-19}$
$E = 4.71385 \times 10^{-23}$    $F = -5.94448 \times 10^{-27}$ Aspherical Surface Data for Surface No. 33

$\kappa = 0.00000$
$A = 9.36074 \times 10^{-10}$    $B = -4.28253 \times 10^{-13}$
$C = -7.46527 \times 10^{-16}$    $D = -1.53426 \times 10^{-21}$
$E = 6.74747 \times 10^{-24}$    $F = -7.35655 \times 10^{-28}$ Aspherical Surface Data for Surface No. 40

$\kappa = 0.00000$
$A = -8.45070 \times 10^{-09}$    $B = 1.41195 \times 10^{-12}$
$C = 1.50504 \times 10^{-16}$    $D = 1.26991 \times 10^{-20}$
$E = -4.37500 \times 10^{-25}$    $F = 1.31886 \times 10^{-29}$ Aspherical Surface Data for Surface No. 51

Figure 12A:
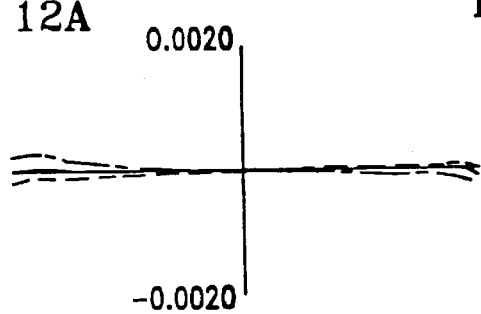
FIGS. 12A–12F are aberration plots of the projection optical system according to Working Example 4 of FIG. 11A.
Figure 12D:
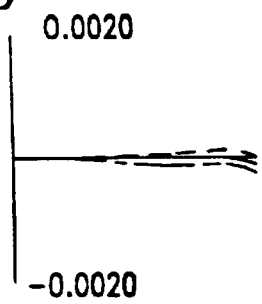
Figure 12B:
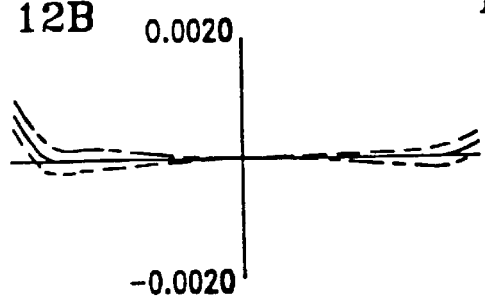
Figure 12E:
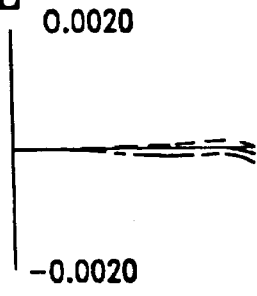
Figure 12C:
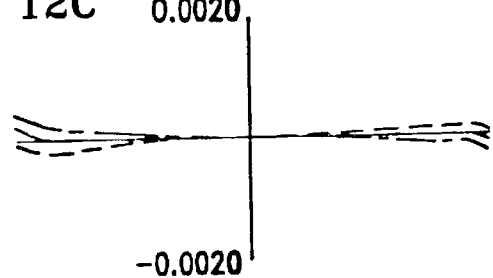
Figure 12F:
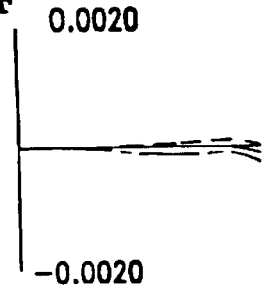

$\kappa = 0.00000$
$A = 3.58298 \times 10^{-07}$    $B = -2.39947 \times 10^{-11}$
$C = -1.91987 \times 10^{-15}$    $D = 8.16510 \times 10^{-19}$
$E = -1.44401 \times 10^{-22}$    $F = 4.59232 \times 10^{-28}$ FIGS. 12A–12E are lateral aberration plots for projection optical system PL4 according to Working Example 4. FIG. 12A is a lateral aberration plot in the meridional direction at image height Y=8.2 mm, FIG. 12B is a lateral aberration plot in the meridional direction at image height Y=4.1 mm, FIG. 12C is a lateral aberration plot in the meridional direction at image height Y=0 mm, FIG. 12D is a lateral aberration plot in the sagittal direction at image height Y=8.2 mm, FIG. 12E is a lateral aberration plot in the sagittal direction at image height Y=4.1 mm, and FIG. 12F is a lateral aberration plot in the sagittal direction at image height Y=0 mm. In each of the lateral aberration plots in FIG. 12A to FIG. 12F, the solid line is the aberration curve at wavelength λ=157.624 nm, the broken line is the aberration curve at wavelength λ=157.624 nm+0.5 pm, and the chain line is the aberration curve at wavelength λ=157.624 nm−0.5 pm.

As can be seen from each of the aberration plots 12A-12E, aberrations are satisfactorily corrected in the projection optical system PL4. In particular, chromatic aberration with respect to an exposure energy beam having a wavelength width of ±0.5 pm is satisfactorily corrected. Projection optical system PL4 uses only fluoride crystals as the dioptric optical members, and has the advantage that fluctuations in irradiation are not easily produced even at wavelengths under 160 nm. Accordingly, by assembling the projection optical system according to Working Example 4 in an exposure apparatus, an extremely fine pattern can be stably transferred onto a wafer.

WORKING EXAMPLE 5

Figure 13:
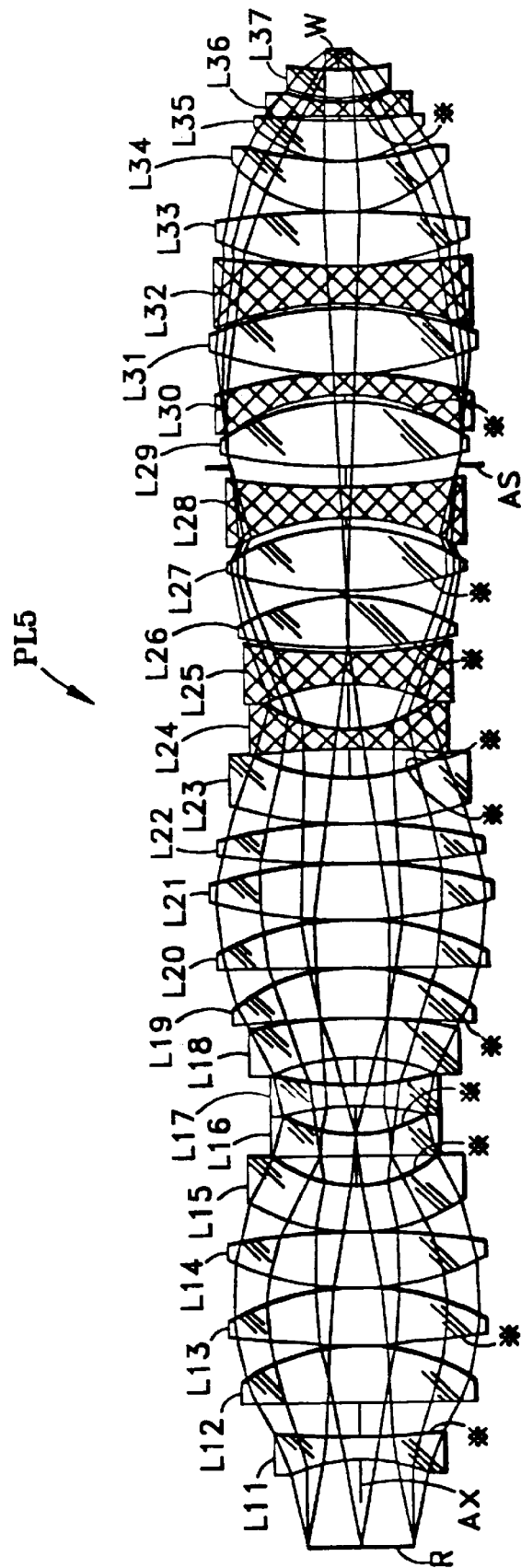
FIG. 13 is a schematic optical diagram of the projection optical system according to Working Example 5.

FIG. 13 is a schematic optical diagram of a projection optical system PL5 according to Working Example 5. Projection optical system PL5 of Working Example 5 is optimized for an exposure energy beam having wavelength λ=157.624 nm and a wavelength width (FWHM) of ±0.5 pm (±0.0005 nm).

In FIG. 13, projection optical system PL5 comprises a plurality of lens elements arranged linearly along optical axis Ax. Projection optical system PL5 also has, in order from the reticle R side, biconcave lens L11, three biconvex lenses L12, L13, L14, two negative meniscus lenses L15, L16 whose concave surfaces face the wafer W side, biconcave lens L17, negative meniscus lens L18 whose concave surface faces the reticle R side, positive meniscus lens L19 whose concave surface faces the reticle R side, three biconvex lenses L20, L21, L22, negative meniscus lens L23 whose concave surface faces the wafer W side, two biconcave lenses L24, L25, two biconvex lenses L26, L27, biconcave lens L28, aperture stop AS, biconvex lens L29, negative meniscus lens L30 whose concave surface faces the reticle R side, biconvex lens L31, biconcave lens L32, biconvex lens L33, two positive meniscus lenses L34, L35 whose concave surfaces face the wafer W side, negative meniscus lens L36 whose concave surface faces the wafer W side, and positive meniscus lens L37 whose concave surface faces the wafer W side.

In the projection optical system PL5, negative lenses L24, L25, L28, L30, L32, L36 are made of barium fluoride ($BaF_2$), and lenses (refractive optical elements) outside of negative lenses L24, L25, L28, L30, L32, L36 are made of calcium fluoride (fluorite, $CaF_2$).

In projection optical system PL5, the lens surface on the wafer W side of negative lens L11, the lens surface on the reticle R side of positive lens L13, the lens surface on the wafer W side of negative lens L15, the lens surface on the wafer W side of negative lens L16, the lens surface on the reticle R side of positive lens L19, the lens surface on the wafer W side of negative lens L23, the lens surface on the reticle R side of negative lens L24, the lens surface on the wafer W side of negative lens L25, the lens surface on the reticle R side of positive lens L27, the lens surface on the reticle R side of negative lens L30, and the lens surface on the wafer W side of positive lens L35 are rotationally symmetric aspherical surfaces. To further increase performance and compactness, the number of aspherical lens surfaces may also be increased.

Table 13 below lists the lens data for projection optical system PL5 according to Working Example 5. The parameters for optical specifications r, d, d0, WD, β and NA in Table 13 are the same as those in Table 2 in Working Example 1.

In addition, refractive index n(λ), with respect to wavelength λ of the exposure energy beam, and dispersion dn/dλ which is the amount of change in the refractive index per 1 pm of wavelength, are shown for barium fluoride $BaF_2$ in Table 12 below.

TABLE 12

| | n (157.6245 nm) | n (157.624 nm) | n (157.6235 nm) | dn/dλ |
|---|---|---|---|---|
| $BaF_2$ | 1.6510960 | 1.651100 | 1.6211040 | $-3.991 \times 10^{-6}$ |

TABLE 13 d0 = 53.9318
WD = 12.0917
|β| = ¼
NA = 0.75

| Surface No. | Radius of Curvature r (mm) | Surface Spacing d (mm) | Material | |
|---|---|---|---|---|
| 1 | −100.35193 | 12.2780 | Fluorite | L11 |
| *2 | 173.25952 | 22.5188 | | |
| 3 | 2957.10647 | 37.5294 | Fluorite | L12 |
| 4 | −123.91124 | 1.0000 | | |
| *5 | 401.76915 | 30.9558 | Fluorite | L13 |
| 6 | −167.12701 | 1.0000 | | |
| 7 | 160.14344 | 32.5639 | Fluorite | L14 |
| 8 | −561.13914 | 1.0000 | | |
| 9 | 130.84694 | 27.5637 | Fluorite | L15 |
| *10 | 64.14937 | 19.7545 | | |
| 11 | 1326.12657 | 12.0588 | Fluorite | L16 |
| *12 | 79.28038 | 19.7487 | | |
| 13 | −179.38889 | 12.0000 | Fluorite | L17 |
| 14 | 175.85617 | 16.8500 | | |
| 15 | −126.34477 | 21.7662 | Fluorite | L18 |
| 16 | −430.76041 | 1.0035 | | |
| *17 | −554.05872 | 32.7681 | Fluorite | L19 |
| 18 | −125.92657 | 1.1241 | | |
| 19 | 2457.92518 | 31.5823 | Fluorite | L20 |
| 20 | −220.14715 | 1.0000 | | |
| 21 | 354.79802 | 31.5155 | Fluorite | L21 |
| 22 | −282.33926 | 1.0000 | | |
| 23 | 478.43567 | 21.1371 | Fluorite | L22 |
| 24 | −578.52465 | 1.0000 | | |
| 25 | 226.92835 | 28.5955 | Fluorite | L23 |
| *26 | 122.08258 | 14.6058 | | |
| *27 | −2764.92201 | 12.0000 | Barium fluoride | L24 |
| 28 | 92.56074 | 27.8925 | | |
| 29 | −115.33400 | 18.9417 | Barium fluoride | L25 |
| *30 | 294.27651 | 2.2139 | | |
| 31 | 379.26874 | 29.2078 | Fluorite | L26 |
| 32 | −149.78065 | 1.0000 | | |
| *33 | 219.84522 | 39.6877 | Fluorite | L27 |
| 34 | −137.89130 | 2.2987 | | |
| 35 | −145.40651 | 20.0000 | Barium fluoride | L28 |
| 36 | 651.33144 | 5.0000 | | |
| 37 | ∞ | 5.0000 | | AS |
| 38 | 297.13381 | 44.9643 | Fluorite | L29 |
| 39 | −153.88170 | 3.4389 | | |
| *40 | −137.51846 | 12.2111 | Barium fluoride | L30 |
| 41 | −338.49514 | 2.2552 | | |
| 42 | 222.41705 | 42.3168 | Fluorite | L31 |
| 43 | −199.07230 | 1.6303 | | |
| 44 | −190.03065 | 20.0000 | Barium fluoride | L32 |
| 45 | 360.96440 | 1.1493 | | |
| 46 | 200.37522 | 39.5196 | Fluorite | L33 |
| 47 | −615.58720 | 1.1984 | | |
| 48 | 82.52054 | 32.9835 | Fluorite | L34 |
| 49 | 218.09275 | 1.0366 | | |
| 50 | 78.65925 | 25.8579 | Fluorite | L35 |
| *51 | 450.22903 | 2.1898 | | |
| 52 | 437.09594 | 13.0000 | Barium fluoride | L36 |
| 53 | 87.74560 | 1.9672 | | |
| 54 | 99.48304 | 17.7667 | Fluorite | L37 |
| 55 | 146.38489 | (WD) | | |

TABLE 14

Aspherical Surface Data for Surface No. 2

κ = 0.00000
A = −2.12961 × 10$^{-07}$     B = 1.09821 × 10$^{-11}$
C = 2.30928 × 10$^{-15}$     D = −6.53888 × 10$^{-19}$
E = −1.47169 × 10$^{-23}$    F = 1.17423 × 10$^{-26}$

Aspherical Surface Data for Surface No. 5

κ = 0.00000
A = −1.20222 × 10$^{-07}$    B = −5.70833 × 10$^{-12}$
C = 1.54954 × 10$^{-15}$     D = −1.11092 × 10$^{-19}$
E = 1.02230 × 10$^{-24}$     F = 1.54127 × 10$^{-28}$

Aspherical Surface Data for Surface No. 10

κ = 0.00000
A = 7.89247 × 10$^{-08}$     B = −1.10675 × 10$^{-10}$
C = −3.30039 × 10$^{-14}$    D = −5.03380 × 10$^{-18}$
E = 2.56453 × 10$^{-22}$     F = −3.54476 × 10$^{-26}$

Aspherical Surface Data for Surface No. 12

κ = 0.00000
A = −2.64010 × 10$^{-07}$    B = 2.01084 × 10$^{-10}$
C = 4.46106 × 10$^{-14}$     D = 2.45816 × 10$^{-18}$
E = 2.04624 × 10$^{-21}$     F = −7.98657 × 10$^{-27}$

Aspherical Surface Data for Surface No. 17

κ = 0.00000
A = −6.17875 × 10$^{-08}$    B = 1.27502 × 10$^{-11}$
C = 1.65143 × 10$^{-15}$     D = −1.96804 × 10$^{-19}$
E = 4.35607 × 10$^{-23}$     F = −3.91638 × 10$^{-27}$

Aspherical Surface Data for Surface No. 26

κ = 0.00000
A = −6.09308 × 10$^{-08}$    B = −1.38511 × 10$^{-11}$
C = 1.09647 × 10$^{-15}$     D = −6.54943 × 10$^{-19}$
E = −5.76995 × 10$^{-23}$    F = −6.80525 × 10$^{-27}$

Aspherical Surface Data for Surface No. 27

κ = −1.63840 × 10$^{+03}$
A = −6.35540 × 10$^{-08}$    B = 1.02179 × 10$^{-11}$
C = 1.19695 × 10$^{-15}$     D = −1.88021 × 10$^{-18}$
E = 3.05419 × 10$^{-22}$     F = −2.39670 × 10$^{-26}$

Aspherical Surface Data for Surface No. 30

κ = 0.00000
A = −1.74936 × 10$^{-08}$    B = 1.16777 × 10$^{-11}$
C = −2.82030 × 10$^{-15}$    D = 1.59537 × 10$^{-19}$
E = 4.95954 × 10$^{-23}$     F = −6.59274 × 10$^{-27}$

Aspherical Surface Data for Surface No. 33

κ = 0.00000
A = −1.19387 × 10$^{-10}$    B = −7.67124 × 10$^{-13}$
C = −7.41363 × 10$^{-16}$    D = −3.87775 × 10$^{-21}$
E = 8.27365 × 10$^{-24}$     F = −1.01103 × 10$^{-27}$

Aspherical Surface Data for Surface No. 40

κ = 0.00000
A = −8.13628 × 10$^{-09}$    B = 1.22451 × 10$^{-12}$
C = 1.25817 × 10$^{-16}$     D = 1.39682 × 10$^{-20}$
E = −5.34992 × 10$^{-25}$    F = 2.86241 × 10$^{-29}$

Aspherical Surface Data for Surface No. 51

κ = 0.00000
A = 3.70718 × 10$^{-07}$     B = −2.46491 × 10$^{-11}$
C = −2.11213 × 10$^{-15}$    D = 7.18299 × 10$^{-19}$
E = −7.02161 × 10$^{-23}$    F = −2.59543 × 10$^{-26}$

Figure 14A:
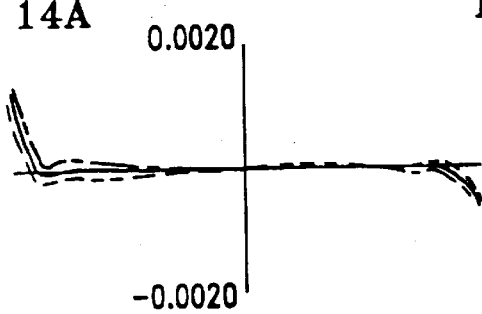
FIGS. 14A–14F are aberration plots of the projection optical system according to Working Example 5 of FIG. 13.
Figure 14D:
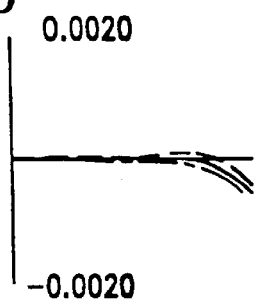
Figure 14B:
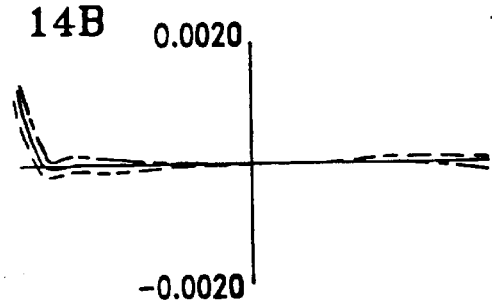
Figure 14E:
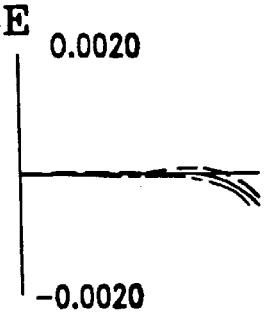
Figure 14C:
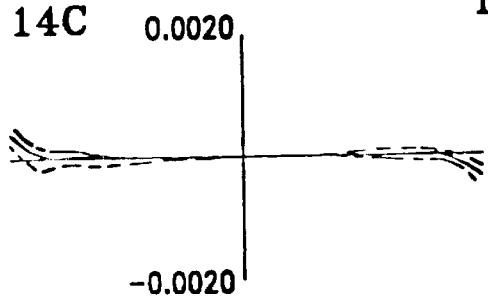
Figure 14F:
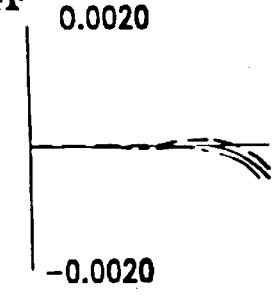

FIGS. 14A–14E are lateral aberration plots for wafer W of projection optical system PL5 according to Working Example 5. FIG. 14A is a lateral aberration plot in the meridional direction at image height Y=8.2 mm, FIG. 14B is a lateral aberration plot in the meridional direction at image height Y=4.1 mm, FIG. 14C is a lateral aberration plot in the meridional direction at image height Y=0 mm, FIG. 14D is a lateral aberration plot in the sagittal direction at image height Y=8.2 mm, FIG. 14E is a lateral aberration plot in the sagittal direction at image height Y=4.1 mm, and FIG. 14F is a lateral aberration plot in the sagittal direction at image height Y=0 mm. In each of the lateral aberration plots in FIG. 14A to FIG. 14F, the solid line is the aberration curve at wavelength λ=157.624 nm, the broken line is the aberration curve at wavelength λ=157.624 nm+0.5 pm, and the chain line is the aberration curve at wavelength λ=157.624 nm−0.5 pm.

As can be seen from each of the aberration plots of FIGS. 14A–14F, aberrations are satisfactorily corrected in projection optical system PL5. In particular, chromatic aberration with respect to an exposure energy beam having a wavelength width of ±0.5 pm is satisfactorily corrected. Projection optical system PL5 uses only fluoride crystals as the dioptric optical members, and has the advantage in that fluctuations in irradiation are not easily produced even at wavelengths under 160 nm. Accordingly, by assembling projection optical system PL5 in an exposure apparatus, an extremely fine pattern can be stably transferred onto a wafer.

Table 14 below lists the numerical values corresponding to the conditions of projection optical systems PL1–PL5 according to Working Examples 1–5, respectively.

TABLE 14

|  | (1) ΣDc/ΣD | (2) \|(dn1/dλ)-(dn2/dλ)\| |
|---|---|---|
| Working Example 1 | 0.95 | 0.6 × 10$^6$ |
| Working Example 2 | 0.94 | 0.6 × 10$^6$ |
| Working Example 3 | 0.85 | 0.35 × 10$^6$ |
| Working Example 4 | 0.68 | 0.8 × 10$^6$ |
| Working Example 5 | 0.86 | 1.591 × 10$^6$ |

Figure 15:
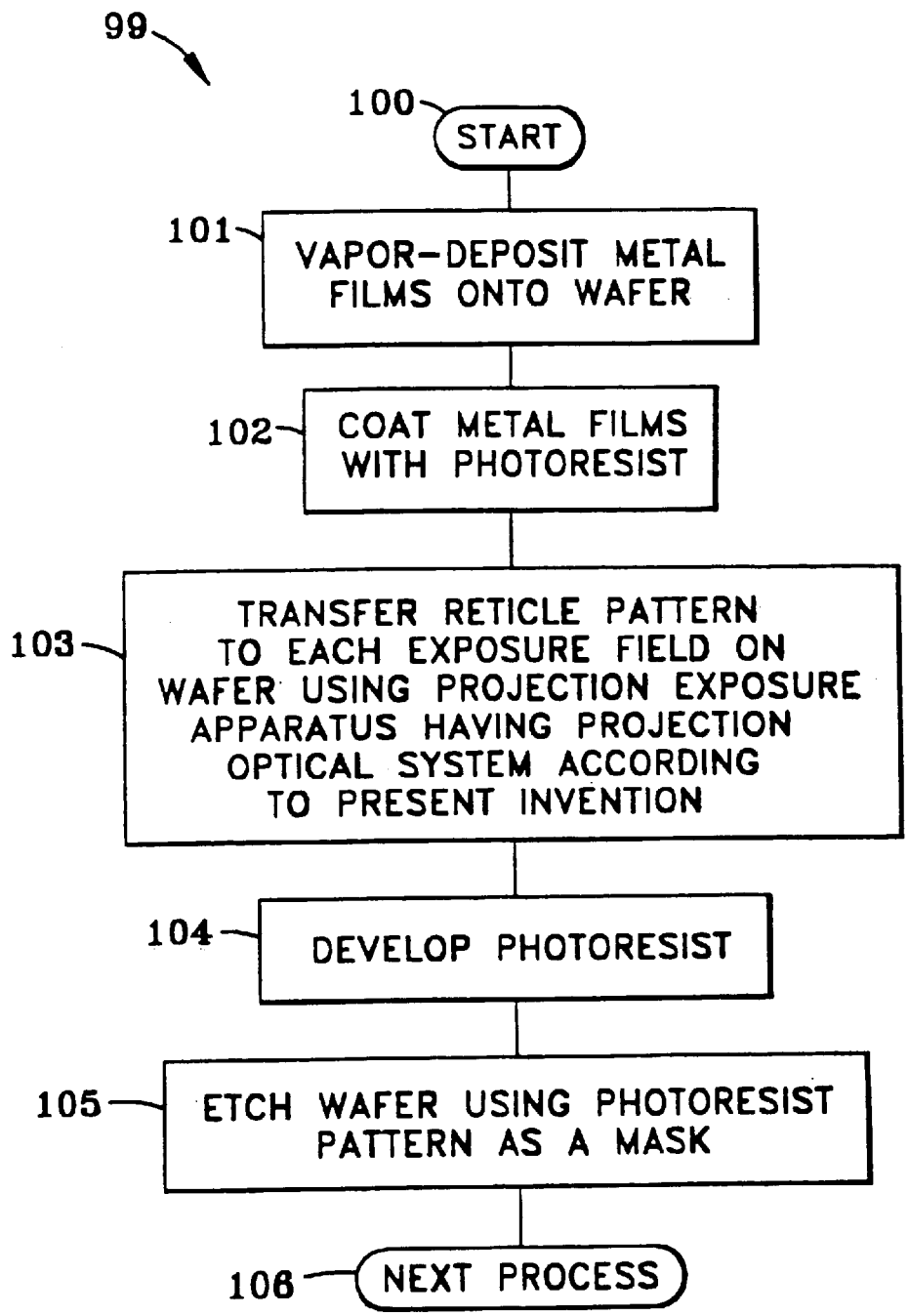
FIG. 15 is a flowchart of one embodiment for carrying out the method of manufacturing a device according to the present invention.

The following explains one example of operation when forming a predetermined circuit pattern on a wafer using a projection optical system according to the present invention, referencing flowchart 99 in FIG. 15.

First, after the "start" step 100, in step 101, metal films are deposited onto each wafer W in a lot of wafers. In the following step 102, photoresist is coated onto the metal films of each wafer W in the lot of wafers. Subsequently, in step 103, using the projection exposure apparatus of the present invention with a projection optical system PL, such as projection optical systems PL1–PL5 of Working Examples 1–5, respectively, the image of the pattern on reticle R is sequentially exposed and transferred via that projection optical system PL onto each exposure region 16 on each wafer W in the lot of wafers. Subsequently, in step 104, the photoresist on each wafer in the lot of wafers is developed. By performing etching using the resist patterns as a mask in step 105, the circuit pattern corresponding to the pattern on reticle R is formed in each exposure region 16 on each wafer W. Subsequently, the manufacture of devices like semiconductor devices is completed by further forming circuit patterns on upper layers, as indicated by step 106, "next process."

The projection optical system of each Working Example described above has the advantage that fluctuations in irradiation tend not to be produced even if only fluoride crystals are used as the dioptric optical members and the wavelength is under 200 nm. As such, extremely fine patterns can be transferred onto a wafer.

Furthermore, in the above-described Working Examples, chromatic aberration is corrected by combining two or more types of fluoride crystals; however, this correcting effect may be combined with the chromatic aberration correcting effect of a diffractive optical element by adding a diffractive optical element to the projection optical system. In this case, if a transmissive diffractive optical element is used as the diffractive optical element, it is preferable to provide the diffractive optical element on a substrate made of fluoride crystal. In addition, such a diffractive optical element may also be provided on the reflective surface of a reflective member like a concave mirror, convex mirror or plane mirror.

Also, although an $F_2$ laser is preferably used as the light source in the above working examples, the higher harmonics of a solid state laser like a YAG laser having an oscillation spectrum of 157 nm may be used instead. In addition, higher harmonics may also be used wherein the laser light of a single wavelength in the visible region or infrared region oscillated from a distributed feedback (DFB) semiconductor laser or a fiber laser is amplified by a fiber amplifier doped with, for example, erbium (or, both erbium and indium), and its wavelength is then transformed to ultraviolet light using a non-linear optical crystal.

For example, if the oscillation wavelength of single wavelength laser light is set the range of 1.51 to 1.59 μm, then the tenth harmonic, wherein the wavelength generated is in the range of 151 to 159 nm, is output. In particular, if the oscillation wavelength is set within the range of 1.57 to 1.58 μm, then the tenth harmonic, wherein the generated wavelength is in the range of 157 to 158 nm, namely ultraviolet light of substantially the same wavelength as $F_2$ laser light, is obtained. In addition, if the oscillation wavelength is set in the range of 1.03 to 1.12 μm, then the seventh harmonic, wherein the generated wavelength is in the range of 147 to 160 nm, is output. In particular, if the oscillation wavelength is set within the range of 1.099 to 1.106 μm, then the seventh harmonic, wherein the generated wavelength is in the range of 157 to 158 nm, namely ultraviolet light of substantially the same wavelength as $F_2$ laser light, is obtained. Furthermore, an yttrium-doped fiber laser may be used as the single-wavelength oscillating laser.

Thus, if the higher harmonics of a laser light source are used, it can be substituted for light source 2 discussed above, since these higher harmonics themselves have a sufficiently narrow spectral width (for example, on the order of 0.3 pm or below).

In addition to using the exposure apparatus of the present invention for the manufacture of semiconductor devices, it can also be used to manufacture displays, including liquid crystal display devices wherein a device pattern is transferred onto a glass plate, to manufacture thin film magnetic heads wherein a device pattern is transferred onto a ceramic wafer, and to manufacture image pickup devices such as CCDs. In addition, the present invention can also be applied to an exposure apparatus that transfers a circuit pattern onto a glass substrate or silicon wafer to manufacture a reticle or mask.

Furthermore, it is understood that the present invention is not limited to the above embodiments for carrying out the present invention, and encompasses various configurations in a range that does not violate the spirit of the present invention.

What is claimed is:

1. A projection objective for forming an image of an object, comprising:

a plurality of optical elements arranged in an optical path between the object and the image, the plurality of optical elements are formed of crystalline material;

the crystalline material of at least one of the optical elements is arranged so as to reduce an adverse effect of exposure energy on the crystalline material of the at least one optical element.

2. The projection objective according to claim 1, wherein the crystalline material comprises fluoride crystalline material.

3. The projection objective according to claim 2, wherein the fluoride crystalline material comprises calcium fluoride.

4. The projection objective according to claim 3, wherein the at least one optical element is a cube-type beam splitter.

5. The projection objective according to claim 4, wherein the crystalline material of the cube-type beam splitter has a (111) face that is perpendicular to an energy beam that passes through the cube-type beam splitter.

6. The projection objective according to claim 1, wherein the crystalline material of the at least one optical element has a (111) face that is perpendicular to an energy beam that passes through the at least one optical element.

7. An exposure apparatus that transfers an image of a pattern on a mask onto a substrate, comprising:

a light source;

an illumination optical system arranged in an optical path between the light source and the mask; and the projection objective according to claim 1.

8. The exposure apparatus according to claim 7, wherein the light source supplies an exposure energy beam having a wavelength under 200 nm.

9. A method for transferring an image of a pattern on a mask onto a substrate, comprising the steps of:

illuminating the mask; and projecting the image of the pattern on the mask onto the substrate by using the projection objective according to claim 1.

10. The method according to claim 9, wherein the mask is illuminated by supplying an exposure energy beam having a wavelength under 200 nm.

* * * * *

UNITED STATES PATENT AND TRADEMARK OFFICE
CERTIFICATE OF CORRECTION

PATENT NO.         : 6,707,601 B2
APPLICATION NO. : 10/419006
DATED              : March 16, 2004
INVENTOR(S)        : Suenaga It is certified that error appears in the above-identified patent and that said Letters Patent is hereby corrected as shown below:

On title page Item (12) and (75) on the patent to read:

(75) Inventors: Yutaka Suenaga, Yokohama (JP)
(12) should read Suenaga

Signed and Sealed this

Twenty-first Day of November, 2006

JON W. DUDAS
*Director of the United States Patent and Trademark Office*